US006937949B1

(12) United States Patent
Fishman et al.

(10) Patent No.: US 6,937,949 B1
(45) Date of Patent: Aug. 30, 2005

(54) SYSTEM AND METHOD OF PROCESSING A DATA SIGNAL

(75) Inventors: Alex Fishman, Sunnyvale, CA (US); Konstantinos G. Haritos, Saratoga, CA (US); Paul Sung, Saratoga, CA (US); Dmitri Bannikov, Mountain View, CA (US); Serguei Dorofeev, Sunnyvale, CA (US)

(73) Assignee: Finisar Corporation, Sunnyvale, CA (US)

( * ) Notice: Subject to any disclaimer, the term of this patent is extended or adjusted under 35 U.S.C. 154(b) by 239 days.

(21) Appl. No.: 10/285,082

(22) Filed: Oct. 31, 2002

(51) Int. Cl.[7] ................................................ G06F 19/00

(52) U.S. Cl. ........................... 702/69; 702/79; 702/189; 375/226

(58) Field of Search .............................. 702/69, 66, 70, 702/71, 73–76, 78, 79, 117, 118, 124–126, 122, 189, 176, 178; 375/224–228, 371; 714/724, 731, 744, 819, 821, 824, 703, 704, 708, 712, 715, 799, 742, 738; 370/516–519, 241; 324/765, 76.15, 76.42, 76.35; 341/165, 162, 94, 122, 123; 377/33, 67, 72

(56) References Cited

U.S. PATENT DOCUMENTS

| | | | | | |
|---|---|---|---|---|---|
| 5,268,949 | A | | 12/1993 | Watanabe et al. | 377/33 |
| 5,748,672 | A | * | 5/1998 | Smith et al. | 375/226 |
| 5,761,216 | A | | 6/1998 | Sotome et al. | 714/738 |
| 6,661,836 | B1 | * | 12/2003 | Dalal et al. | 375/226 |
| 6,694,462 | B1 | * | 2/2004 | Reiss et al. | 714/724 |

* cited by examiner

*Primary Examiner*—Hal Wachsman
(74) *Attorney, Agent, or Firm*—Workman Nydegger

(57) ABSTRACT

Systems and methods for testing bit processing capacities of electronic devices and for reducing or eliminating jitter that compromises the ability of electronic devices to perform this task. Embodiments include circuitry and a methodology for locating and employing a data signal delay—in conjunction with a latch—to reduce or eliminate jitter from serial encoded data generated by a serializer/deserializer. The data signal delay ensures that the latch latches a state of the serial encoded data at a position within a data signal cycle of minimum jitter.

27 Claims, 11 Drawing Sheets

BERT 300

SYSTEM AND METHOD OF PROCESSING A DATA SIGNAL

The present invention relates generally to an improvement in the ability of test systems to test bit processing capacities of electronic devices, and in particular to the elimination of jitter that compromises the ability of these systems to perform this task.

BACKGROUND OF THE INVENTION

A bit error rate ("BER") is a ratio of bits received, processed, and/or transmitted with errors to a total number of bits received, processed, and/or transmitted over a given period of time. A BER is typically expressed as ten to a negative power. If, for example, a transmission comprises 1 million bits and one of these bits is in error (e.g., a bit is a first logic state instead of a second logic state), the transmission has a BER of $10^{-6}$. The BER is useful because it may characterize the ability of a device to receive, process, and/or transmit bits.

Many devices are designed to receive, process, and then transmit a plurality of bits. An optoelectronic transceiver, for example, typically receives a plurality of bits in an electrical form and then transforms and transmits the bits in an optical form and/or receives a plurality of bits in an optical form and then transforms and transmits the bits in an electrical form.

To derive a BER for a device under test ("DUT"), bits transmitted to the DUT are compared to corresponding bits transmitted by the DUT or to corresponding bits in a pattern used to generate the bits transmitted to the DUT. In some applications, the BER of a DAT must be below a defined threshold for the DUT to pass a test.

A Bit Error Rate Test or Tester ("BERT") is a procedure or device that establishes a BER for a DUT or to otherwise quantify a DUT's ability to receive, process, and/or transmit bits. More specifically, a BERT measures the BER of a transmission (e.g., bits transmitted, received, or processed) over a given period of time by a DUT. An exemplary BERT includes, among other components, a serializer/deserializer ("SERDES") and a clock source fixed to a host board (e.g., PCB, circuit board, etc.). Typically, the SERDES produces serial encoded data (e.g., the bits) used to establish a BER for a DUT. More specifically, serial encoded data is transmitted from a SERDES to a DUT, which attempts to transmit the serial encoded data back to the SERDES. The SERDES compares the output of the DUT to the input to the DUT (or what the input should have been).

In order to obtain useful information from the test, bits are transmitted by the SERDES to the DUT at a specific data rate, which is controlled by the clock source. The temporal duration of a single bit (e.g., the bit period) is called the unit interval (UI). The UI is ideally the same for each bit and is equal to the reciprocal of the data rate. The data rate is set by reference to a desired use of the DUT. Until very recently, data rates did not need to exceed 1.0625 Gbps since the DUTs were not designed to operate above this data rate. Advances in technology, however, have resulted in DUTs (e.g., optoelectronic transceivers) that operate at data rates in excess of 10 Gbps.

Because of jitter typically included in data signals transmitted by a SERDES, testing DUTs at frequencies that exceed 1.0625 Gbps may not be reliable. Persons skilled in the art recognize that jitter may be defined as a deviation from the ideal timing of a digital signal event (e.g., the timing of a transition from a first logic state or bit to a second logic state or bit). The jitter j associated with a particular transition t is defined as follows $j=|t_{ideal}t_{actual}|$, where j is a unit of time such as picoseconds, $t_{ideal}$ is the time at which the transition should have occurred, and tactual is the time at which the transition actually occurred. Additionally, the root-mean-square ("RMS") or peak-to-peak jitter for a defined number of transitions are typically employed to evaluate a device. RMS jitter is calculated using standard mathematical techniques. Peak-to-peak jitter for a defined number of transitions is typically computed as follows: $j_{pp}=(t_{max}-t_{ideal})+(t_{ideal}-t_{min})$, where $j_{pp}$ is peak-to-peak jitter, $t_{ideal}$ is the time at which the transitions should have occurred, $t_{max}$ is the latest time at which a transition actually occurred, and $t_{min}$ is the earliest time at which a transition actually occurred. Additionally, normalized jitter or jitter in UI is obtained by dividing jitter expressed in units of time by the temporal duration of 1 UI. Normalized jitter or jitter expressed in UI is preferred since it does not depend on data rate.

Jitter is comprised of random (i.e., unpredictable) jitter and deterministic jitter. Deterministic jitter is caused by process or component interactions of a system. Random jitter is typically caused by thermal (or other random) noise effects of a system that affect the phase of the clock and/or data signals. For measurements encompassing random jitter, it is necessary to collect sufficient amounts of data to have a statistically valid jitter distribution. Histogram data of jitter should include, therefore, many thousands or millions of acquisitions to yield valid statistics.

Jitter performance of devices (e.g., a SERDES, a DUT) is specified in terms of jitter generation, jitter transfer, and jitter tolerance. Jitter generation may be defined as the amount of jitter added to a clock and/or data signal by a device. Jitter transfer is the amount of jitter present in a clock and/or data input signal received by a device that is transferred, by the device, to the clock and/or data output signal of the device. Jitter transfer may change with the data rate, so jitter transfer is typically expressed as the ratio of output jitter to input jitter at a specific data rate.

The ability of a device to correctly determine the value or state of a received data signal despite jitter is called jitter tolerance. Jitter tolerance can be defined as the amount jitter in a data signal received by a device that causes, for example, the BER of the device to exceed a specified limit. Devices that must process a digital signal (e.g., a DUT) must determine whether a sample (e.g., a voltage level) of a data signal falls within the range of a first logic state or a second logic state (e.g., a binary one or a binary zero). The device compares the sample to a reference value (e.g., a reference voltage) to determine whether the sample represents the first logic state or the second logic state. If the sample is greater than or equal to the reference value, the sample falls within the range of, for example, the first logic state, but if the sample is less than the reference value, the sample falls within the range of the second logic state. As noted above, jitter may shift the transition between logic states. As a result, the data signal may not cross the reference value in time for the device to properly determine the intended state of the sample. When this occurs, a bit error occurs. So as the magnitude of jitter is increased, the incidence of a data signal not crossing the reference value in time for a device (e.g., a DUT) to properly determine the intended state of the sample may increase as well. In other words, as the magnitude of jitter is increased the BER of the device may increase as well.

At lower data rates (e.g., at or below 1.0625 Gbps), jitter present in data signals created by an exemplary SERDES is typically not problematic. The UI of a data signal transmitted at a data rate of, for example, 1.0625 Gbps is approximately 941 picoseconds. Expressed in units of time, the peak-to-peak jitter present in a data signal created by an exemplary SERDES is in the range of 40 to 60 picoseconds, which corresponds to a peak-to-peak jitter range of 0.043 to 0.064 UI and will not mask jitter created by a DUT. In other words, the SERDES 120 may enable an accurate measurement of jitter creation and transfer by a DUT at a data rate of 1.0625 Gbps.

However, the UI of a data signal at a data rate of, for example, 10 Gbps is only 100 picoseconds. At this data rate, a peak-to-peak jitter range of 40 to 60 picoseconds corresponds to a peak-to-peak jitter range of 0.40 to 0.60 UI. This range of peak-to-peak jitter exceeds the jitter tolerance of even the most robust, functional DUTs. In other words, the SERDES 120 may not enable an accurate measurement of jitter creation and transfer by a DUT at a data rate of 10 Gbps (except as described below in connection with the present invention).

As indicated above, a typical DUT has a high jitter transfer rate and/or low jitter tolerance. The DUT may, therefore, fail a jitter test because of jitter present in a data signal transmitted to the DUT by a SERDES. In other words, jitter present in signal transmitted by a DUT may be attributed to the DUT even though the jitter was introduced into the data signal by the SERDES. Similarly, a DUT may fail a bit error rate test due entirely to the jitter introduced by the SERDES into the data signal used to test the DUT.

SUMMARY OF THE INVENTION

The present invention provides a system and method for reducing or eliminating jitter from serial encoded data produced by a SERDES. In particular, the present invention includes a system and method for processing a data signal. This system and method includes a first circuit or set of steps configured to generate a first data signal based on a pattern. The first data signal including variations from the pattern and being transmitted at a first frequency. Also included is a second circuit or set of steps configured to generate a second data signal by delaying the first data signal by a first amount of time that is subject to a series of adjustments. The system and method further includes a third circuit or set of steps configured to latch states of the second data signal. Also included is a fourth circuit or set of steps configured to take measurements of the variations from the pattern by reference to the states of the second data signal following each adjustment in the series of adjustments. Finally, the system and method further includes a fifth circuit or set of steps configured to receive the measurements of the variations from the pattern from the fourth circuit or set of steps. The fifth circuit is (or the fifth steps are) configured to control the series of adjustments so that a measurement of a first spike of the variations is received from the fourth circuit or set of steps (the first spike corresponding to a first delay), control the series of adjustments so that a measurement of a second spike of the variations is also received from the fourth circuit or set of steps (the second spike corresponding to a second delay), and set the first amount of time to a third delay derived from the first delay and the second delay.

The present invention includes still another system and method for processing a data signal. This system and method includes a first circuit or set of steps configured to transmit a first data signal. The first data signal includes a series of transitions between a first logic state and a second logic state. Further, the data signal includes variations from an ideal timing of each transition in this series of transitions. Also included is a second circuit or set of steps configured to generate a second data signal by delaying the first data signal by an amount of time. Further included is a third circuit or set of steps configured to latch a logic state of the second data signal at a frequency less than that of the second data signal. Finally, the system and method further includes a fourth circuit or set of steps configured to (1) incrementally adjust the amount of time until a total of the adjustments corresponds to the at which logic states are latched, (2) prompt the transmission of the data signal following each adjustment of the amount of time, (3) process a plurality of latched logic states for each data signal transmitted, (4) identify one of each data signal transmitted that includes a first peak of unintended state changes and subsequently corresponds to a first adjusted value of the amount of time, (5) identify another data signal transmitted that includes a second peak of unintended state changes and corresponds to a second adjusted value of the amount of time, and (5) set the amount of time to an ideal value that is derived from the first adjusted value and the second adjusted value.

The present invention includes yet another system and method for processing a data signal. This system and method includes a first circuit or set of steps configured to transmit a first data signal. The first data signal includes a series of transitions between a first logic state and a second logic state and variations from an ideal timing of each transition in the series of transitions. Also included is a second circuit or set of steps configured to generate a second data signal by delaying the first data signal by an amount of time and a third circuit configured to latch logic states of the second data signal. The first circuit is (or the first set of steps are) configured to process logic states latched by the third circuit by determining a count of latched logic states in error. Finally, the system and method further includes a fourth circuit or set of steps configured to (1) incrementally adjust the amount of time, (2) prompt the transition of the data signal following each adjustment of the amount of time, (3) process the count of logic states in error for each data signal transmitted, (4) identify one of the data signals transmitted that includes a first peak of logic states in error and that subsequently corresponds to a first adjusted value of the amount of time, (5) identify another one of the data signals transmitted that includes a second peak of logic states in error and subsequently corresponds to a second adjusted value of the amount of time, and (6) set the amount of time to an ideal value derived from the first adjusted value and the second adjusted value.

The present invention includes another system and method for processing a data signal. This system and method includes a first circuit or set of steps configured to transmit a first data signal. The first data signal includes transitions between a first logic state and a second logic state and variations from an ideal timing of the transitions. Also included is a second circuit or set of steps configured to generate a second data signal by delaying the first data signal by an ideal amount of time. Further included is a third circuit or set of steps configured to latch logic states of the second data signal in response to state transitions in a received clock signal. The first circuit or set of steps are configured to receive from the electronic device under test a data signal derived from the latched logic states and determine whether the data signal derived from the latched logic states is consistent with the first data signal. Finally, the ideal delay is set so that the state transitions in the received clock signal occur substantial midway between temporal boundaries of bit periods included in the first data signal.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

Figure 1:
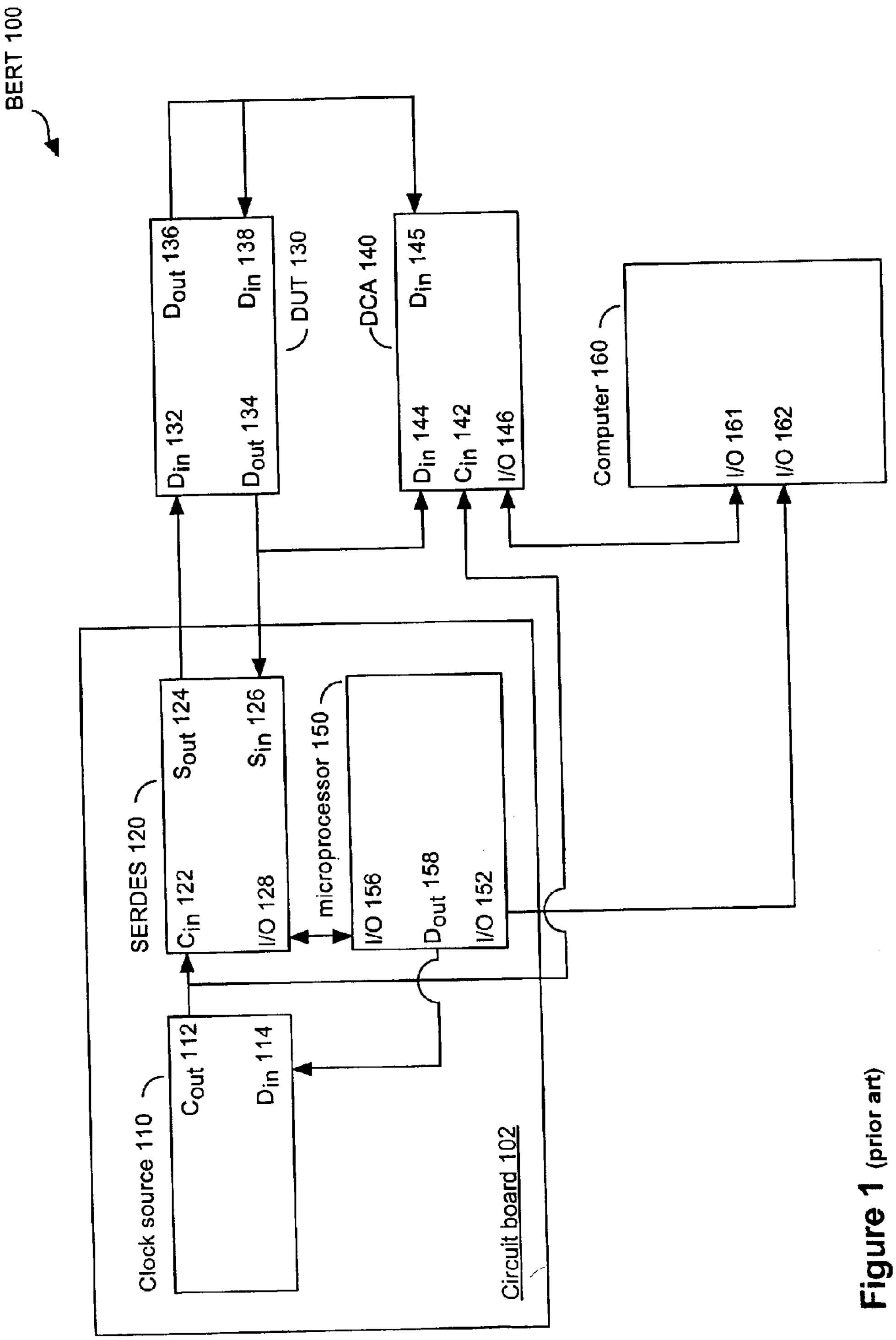
FIG. 1 is a block diagram of a prior art BERT.

Referring to FIG. 1, there is shown a prior art BERT 100 for testing a DUT 130. As illustrated in FIG. 1, BERT 100 includes a circuit board 102, a clock source 110, a SERDES 120, a digital communication analyzer ("DCA") 140, a microprocessor 150, and a computer 160.

The circuit board 102 typically comprises an insulated board on which interconnected circuits and components (e.g., the clock source 110 and the SERDES 120) are mounted. The circuit board 102 typically provides power and ground connections for the various components mounted thereon.

The clock source 110 is designed to provide a clock signal at a desired frequency. The clock source 110 may comprise a single, self contained circuit (e.g., an AMPTRON® or Cardinal Components, Inc. crystal based oscillator). Such circuits are preferably single frequency circuits, but the clock source 110 may also have multiple-frequency capability. If so, the microprocessor 150 or a user may select, through a plurality of pins, a divide-by number used by the circuit to divide a maximum clock signal frequency. The clock source 110 may also comprise a plurality of circuits including a primary circuit and external timing components.

Additionally, in the BERT 100 illustrated in FIG. 1, the clock source 110 includes a $C_{out}$ port 112 and a $D_{in}$ port 114. The $C_{out}$ port 112 transmits a clock signal to the various components of a BERT. The $D_{in}$ port 114 comprises one or more control signal pins or leads that enable a user or the microprocessor 150 to select a frequency for the clock signal produced by the clock source 110. Not illustrated in the present application are one or more demultiplexers that enable the clock signal to drive two or more components.

The SERDES 120 may comprise a programmable pattern generator, receiver, and analyzer (e.g., TEXAS INSTRUMENTS® TLJK2501). The pattern generated may comprise pseudo-random patterns 27-1 to 231-1 bits in length. The pattern generated may also comprise a repetitive pattern that, for example, mimics a clock signal (e.g., a series of transitions between a first logic state and a second logic state).

The SERDES 120 typically includes a pattern generator, a pattern detector, an bit error detector, and a control interface. The pattern generator generates a pattern. The pattern detector determines whether received data matches the generated pattern. The bit error detector tracks bits of the received data that do not match corresponding bits in the generated pattern. The control interface enables a microprocessor 150 to select and/or define a pattern, initiate the generation of a pattern, and monitor bit errors.

In the BERT illustrated in FIG. 1 and in conjunction with embodiments of the present invention described below, the SERDES 120 preferably includes a $C_{in}$ port 122, an $S_{out}$ port 124, an $S_{in}$ port 126, and an I/O port 128. The signal transmitted through the $C_{in}$ port 122 is the clock signal produced by the clock source 110. The $S_{out}$ port 124 is used to transmit a generated pattern to a device such as a DUT 130. The $S_{in}$ port 126 is used to receive data from a device such as the DUT 130. The data received through the $S_{in}$ port 126 is subsequently compared to a generated pattern in order to detect bit errors. The I/O port 128 is used to receive control signals and provide access to data, such as an indication of a detected error. The control signals typically emanate from the microprocessor 150. Additionally, the control signals typically comprise a plurality of separate signals including, for example, address bits, an alarm interrupt, a chip select, a write input, a read input, a bus type select, a test input, and an address latch enable.

Generally, the DUT 130 comprises any electronic device capable of receiving a data signal and then transmitting the data signal. More specifically, the DUT 130 typically comprises an optoelectronic transceiver, which is a device capable of receiving a data signal in an electrical form and transmitting the data signal in an optical form and receiving a data signal in an optical form and transmitting the data signal in an electrical form. See currently pending U.S. patent application Ser. No. 10/005,924—entitled "CIRCUIT INTERCONNECT FOR OPTOELECTRONIC DEVICE FOR CONTROLLED IMPEDANCE AT HIGH FREQUENCIES," filed on Dec. 4, 2001, and incorporated herein by reference—for a detailed description of an optoelectronic assembly consistent with the DUT 130. The aforementioned application and the present application share a common assignee.

The DUT 130 preferably includes a Din port 132 and a $D_{out}$ port 134. As illustrated in FIG. 1, the $D_{in}$ port 132 is configured to receive a data signal transmitted by the SERDES 120 through its $S_{out}$ port 124. The $D_{out}$ port 134 is configured to transmit a data signal to the $S_{in}$ port 126 of the SERDES 120 and the $D_{in}$ port 144 of the DCA 140. In preferred embodiments of the present invention, data transmitted between the DUT 130, the SERDES 120, and the DCA 140 through the $D_{in}$ port 132 and the $D_{out}$ port 134 is in an electrical form.

The DUT 130 preferably includes a $D_{out}$ port 136 and a $D_{in}$ port 138 as well. These ports enable the DUT 130 to transmit data to and from other devices, such as the DCA 140, and/or loop data from the $D_{out}$ port 136 back to the $D_{in}$ port 138. In preferred embodiments of the present invention, data transmitted to and from the DUT 130 through the $D_{out}$ port 136 and the $D_{in}$ port 138 is in an optical form. In these embodiments, the DUT 130 is configured to receive a data signal in an electrical form through the $D_{in}$ port 132, transform the data signal to an optical form, and transmit the transformed data signal through the $D_{out}$ port 136. Similarly, the DUT 130 is configured to receive a data signal in an optical form through the $D_{in}$ port 138, transform the data signal to an electrical form, and transmit the transformed data signal through the $D_{out}$ port 134.

The DCA 140 typically comprises a digital, wide-bandwidth oscilloscope. An example of a DCA 140 includes, but is not limited to the AGILENT® 86100B Wide-Bandwidth Oscilloscope. Like digital, wide-bandwidth oscilloscopes in particular, the DCA 140 is able to repetitively sample a data signal (including optical and electrical signals) and perform analyses of the data signal samples. In particular, the DCA 140 is able to measure jitter present in a data signal. More specifically, the DCA is able to calculate peak-to-peak and/or RMS jitter for a sampled data signal.

In the BERT illustrated in FIG. 1 and in conjunction with embodiments of the present invention described below, the DCA 140 preferably includes a $C_{in}$ port 142, a $D_{in}$ port 144, a $D_{in}$ port 145, and an I/O port 146. The signal transmitted through the $C_{in}$ port 142 is a clock signal, which the DCA 140 preferably uses to trigger data signal sampling. The $D_{in}$ port 144 and the $D_{in}$ port 145 receive data signals produced by, for example, the DUT 130. The I/O port 146 receives control signals and provides access to data, such as jitter measurements, The control signals typically comprise a plurality of commands and other instruction. The commands may, for example, direct the DCA 140 to perform one or more analyses on a data signal or request the results of an analysis (e.g., a peak-to-peak jitter measurement). The precise commands used in embodiments of the DCA 140 are beyond the scope of this application. For additional information, see e.g. Programmer's Guide for the infiniium DCA AGILENT® 86100A,B Wide-Bandwidth Oscilloscope, which is available on the AGILENT® web site incorporated herein by reference. Additionally, the inner workings and operation of the DCA 140 are beyond the scope of this application. For additional information, see e.g., *Oscilloscope Guide*, Arnold J. Banks, Delmar Iearing, 1997 and *Oscilloscopes: How to Use Them, How They Work*, Ian Hickman, Butterworth-Heinemann Ltd., 2000, incorporated herein by reference.

The microprocessor 150 typically comprises a computer processor on a microchip such as a MOTOROLA® 8-bit processor. The microprocessor 150 directs the operation of the SERDES 120 and may also configure the clock source 110 (e.g., set the frequency of the clock signal produced by the clock source 110).

Figure 2:
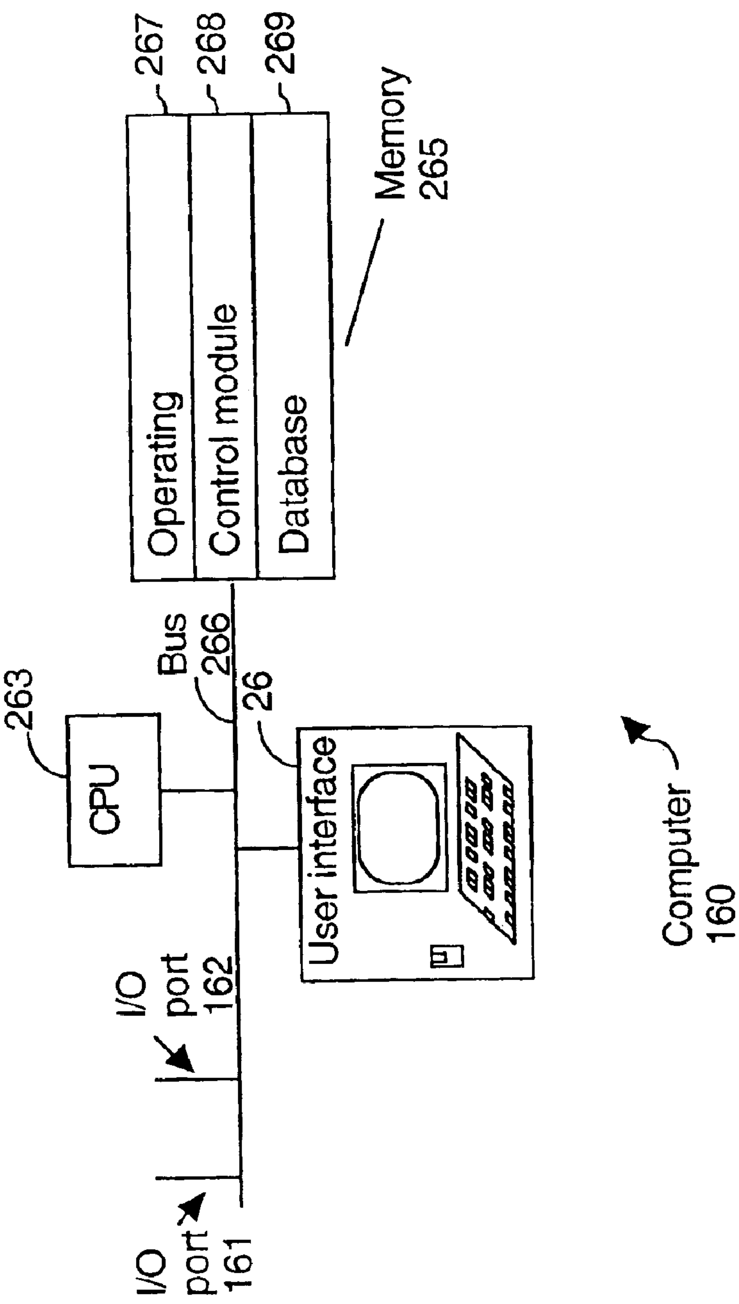
FIG. 2 is a block diagram of a prior art computer.

The computer 160 preferably includes, in addition to the I/O ports 161, 162 illustrated in FIG. 1, standard computer components such as one or more processing units 263, a user interface 264 (e.g., keyboard, mouse, and a display), memory 265, and one or more busses 266 to interconnect these components (FIG. 2). The memory 265, which typically includes high speed random access memory as well as non-volatile storage such as disk storage, stores an operating system 267, a control module 268 for monitoring and controlling the microprocessor 150 and the DCA 140, and a database (or one or more files) 269 for storing transient information and results of DUT 130 tests. The operating system 267 includes procedures for handling various system services and for performing hardware dependent tasks. Further, the one or more processing units 263 execute, for example, the control module 268 under the control of the operating system 267, which also provides the control module 268 with access to system resources, such as the memory 265 and user interface 264.

In operation, the BERT 100 tests the ability of the DUT 130 to receive, transform, and transmit a data signal. In particular, the SERDES 120 transmits (or at least attempts to transmit) a data signal based on a pattern to the DUT 130. The DUT 130 may then loop the data signal back to the DUT 130 and/or transmit the data signal to the DCA 140. The DUT 130 may then transmit the data signal back to the SERDES 120 and/or transmit the data signal to the DCA 140. The SERDES 120 may compare the data transmitted by the DUT 130 to the pattern. In particular, the SERDES 120 may track bits of the received data that do not match corresponding bits in the pattern (i.e., bit errors). The DCA 140 may measure the jitter included in the data signal transmitted through one or both of the $D_{in}$ port 136 and the $D_{out}$ port 134. Measuring jitter at both ports enables the DCA 140 to separately measure jitter created by the $D_{in}$ port 132/ $D_{out}$ port 136 pair and the $D_{in}$ port 134/ $D_{out}$ port 138 pair.

As noted above, a typical DUT 130 has a high jitter transfer rate and/or low jitter tolerance. The DUT 130 may, therefore, fail a jitter test because of jitter present in a data signal transmitted to the DUT 130 by a SERDES 120. In other words, jitter present in a signal transmitted by a DUT 130 may be attributed to the DUT 130 even though the jitter was created by the SERDES 120. Similarly, a DUT 130 may fail a bit error rate test due entirely to the jitter created by the SERDES 120.

Figure 3A:
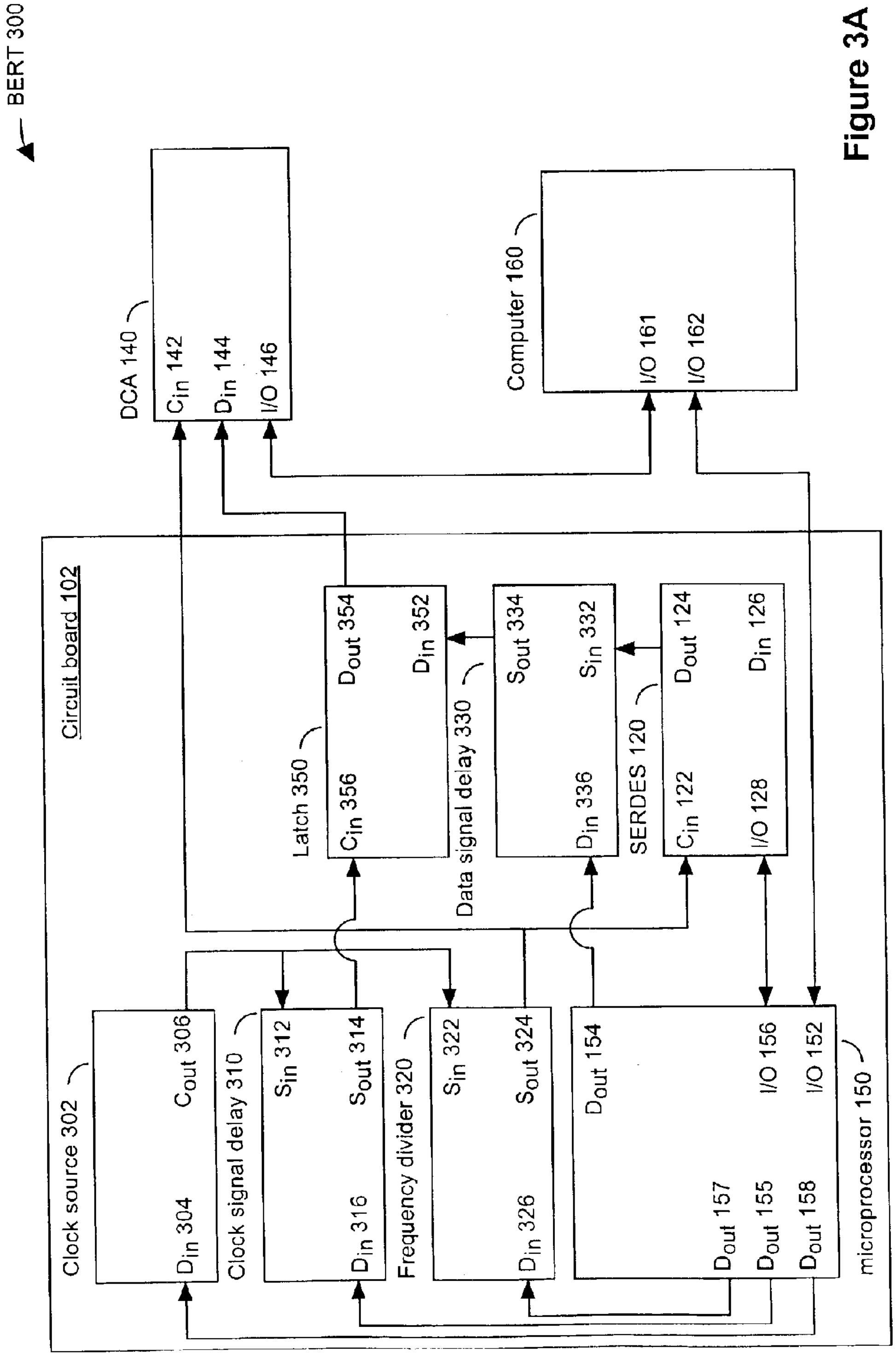
FIG. 3A is a block diagram of a BERT consistent with an embodiment of the present invention.

As noted above, the present invention eliminates jitter present in serial encoded data transmitted by a SERDES 120. FIG. 3A illustrates a BERT 300 consistent with an embodiment of the present invention. This BERT 300 includes all of the components of the BERT 100 explicitly illustrated in FIG. 1, with the exception of the clock source 110, and also includes additional components such as a clock source 302, a clock signal delay 310, a frequency divider 320, a data signal delay 330, and a latch 350.

The clock source 302 (e.g., a Vectron® SAW or PLL based oscillator) is designed to provide a high frequency clock signal. Because the clock source 302 is preferably a SAW or PLL based oscillator, clock signals produced by the clock source 302 have very little jitter. And like the clock source 110, the clock source 302 is preferably a single frequency circuit, but the clock source 302 may also have multiple-frequency capability. If so, the microprocessor 150 or a user may select, through a plurality of pins, a divide-by number used by the circuit to divide a maximum clock signal frequency.

Additionally, the clock source 302 includes a $C_{out}$ port 306 and a $D_{in}$ port 304. The $C_{out}$ port 306 transmits a clock signal to the various components of a BERT. The $D_{in}$ port 304 comprises one or more control signal pins or leads that enable a user or the microprocessor 150 to select a frequency for the clock signal produced by the clock source 302. Not illustrated in the present application are one or more demultiplexers that enable the clock signal to drive two or more components.

The clock signal delay 310 preferably comprises a programmable delay circuit (e.g., the ON SEMICONDUCTOR® MC100EP195 Programmable Delay Chip). Generally, a clock signal (e.g., input pulses) applied to an input of the clock signal delay 310 reappears at an output of the clock signal delay 310 after a delay of a specified amount of time. Preferably, both leading and trailing edges of clock signal pulses are delayed by the same amount of time, which is typically programmable using either a serial or parallel data input.

The clock signal delay 310 preferably includes an $S_{in}$ port 312, an $S_{out}$ port 314, and a $D_{in}$ port 316. The clock signal generated by the clock source 302 is transmitted to the clock signal delay 310 through the $S_{in}$ port 312. The clock signal, after a delay, is transmitted to the latch 350 through the $S_{out}$ port 314. The microprocessor 150 sets the delay of the clock signal delay 310 through the $D_{in}$ port 316, which functions as a control port. The connection to the $D_{in}$ port 316 includes one or more separate leads depending on the specific embodiment.

The clock signal delay is preferably an integer multiple of a clock signal cycle duration. For example, if the frequence of the clock signal is 10 GHz, the duration of a single clock signal cycle is approximately 100 picoseconds. Therefore, the delay of this exemplary clock signal may be one of 0, 100 picoseconds, 200 picoseconds, 300 picoseconds, etc. Note that in some embodiments, the clock signal delay 310 has a fixed minimum delay because of internal buffer chains used to implement the delay. In these embodiments, therefore, a zero second delay is not possible.

The clock signal delay 310, though included in FIG. 3A, is not incorporated in all embodiments of the present invention. The data signal delay 330 is, however, included in all embodiments of the present invention in one form or another. As known in the art, the delay of a signal delay circuit (e.g., the clock signal delay 310 and the data signal delay 330) may be skewed by environmental conditions such as temperature. As a result, when embodiments of the present invention—without the clock signal delay 310—are employed in areas where the environmental conditions change often or if the present invention is calibrated in one environment (as described below in connection with stage 371 of FIG. 3B), but used to test a DUT 130 in another environment (as described below in connection with stage 372 of FIG. 3B), the effectiveness of the present invention may be reduced somewhat due to delay skew in the data signal delay 330. More specifically, the clock source 302 is not affected to the same extent as the data signal delay 330. The timing of interactions between the clock signal, which is produced by the clock source 302, and a data signal transmitted by the data signal delay 330 is instrumental in reducing or eliminating jitter from a data signal produced by the SERDES 120. Skewing the delay affects this timing, and therefore, may limit the effectiveness of the present invention.

Because the clock signal delay 310 is preferably similar or identical to the data signal delay 330, the clock signal delay 310 and the data signal delay 330 are typically affected by environmental conditions in a similar manner and to the same extent. To offset the delay skew in the data signal delay 330, therefore, the clock signal delay 310 is included in the BERT 300. As noted above, the delay of the clock signal delay is preferably an integer multiple of a clock signal cycle duration. The precise multiple is selected by reference to the delay of the data signal delay 330. More specifically, the integer multiple closest to the delay of the data signal delay 330 is preferably selected. But because the delay of the clock signal delay 310 and the delay of the data signal delay 330 are typically different, the delay skew of each may not be identical. For example, if the delay of the data signal delay 330 is 560 picoseconds and the clock signal cycle duration is 400 picoseconds (i.e., the clock signal frequency is 2.5 GHz), the delay of the clock signal delay 310 should be set to 400 picoseconds since this is the integer multiple of the clock signal cycle duration closest to 560 picoseconds. Although the delay skew of the data signal delay 330 and the clock signal delay 310 set to 560 picoseconds and 400 picoseconds, respectively, are not identical, timing variations caused by the respective delay skews are minimized.

The frequency divider 320 preferably comprises one or more programmable frequency divider circuits (e.g., the ON SEMICONDUCTOR® MC100EP32, MC100EP33, MC100EP34, or MC100EP139 Chips). Generally, a clock signal applied to an input of the frequency divider 320 is transmitted at an output of the frequency divider 320 at a fraction of the input frequency. The amount by which the clock signal frequency is divided is programmable using either a serial data input or parallel data input. The clock signal frequency is typically divided by a factor of 10 to 20. For example, if the frequency of the clock signal input to the frequency divider 320 is 10 GHz, the frequency of the clock signal output from the frequency divider 320 is typically 0.5 to 1 GHz.

The frequency divider 320 preferably includes an $S_{in}$ port 322, an $S_{out}$ port 324, and a $D_{in}$ port 326. The clock signal generated by the clock source 302 is transmitted to the frequency divider 320 through the $S_{in}$ port 322. The clock signal—after its frequency is divided—is transmitted to the SERDES 120 through the $S_{out}$ port 324. The microprocessor 150 sets the amount by which the clock signal frequency is divided through the $D_{in}$ port 326, which: functions as a control port. The connection to the $D_{in}$ port 326 includes one or more separate leads depending on the specific embodiment.

The data signal delay 330 preferably comprises a programmable delay circuit similar or identical to the clock signal delay 310. A data signal (e.g., input pulses) applied to an input of the data signal delay 330 reappears at an output of the data signal delay 330, after a delay of a specified amount of time. Preferably, both leading and trailing edges of data signal pulses are delayed by the same amount of time, which is typically programmable by the microprocessor 150 using either a serial or parallel data input.

The data signal delay 330 preferably includes an $S_{in}$ port 332, an $S_{out}$ port 334, and a $D_{in}$ port 336. The data signal generated by the SERDES 120 is transmitted to the data signal delay 330 through the $S_{in}$ port 332. The data signal, after a delay, is then transmitted to the latch 350 through the $S_{out}$ port 334. The microprocessor 150 sets the delay of the data signal delay 330 through the $D_{in}$ port 336, which functions as a control port accessible to the microprocessor 150.

The latch 350 preferably comprises a flip-flop, latch, or other data storage circuit (e.g., the ON SEMICONDUCTOR® MC100EP52 or NBSG53A Chips). A data signal applied to a data input of the latch 350 is sampled by the latch during state transitions of a clock signal applied to a clock signal input of the latch 350. The sampled state is applied to a data output of the latch 350 until another state of the data signal is sampled. As a result, the data signal produced by the latch 350 is updated at a frequency equal to the frequency of the clock signal produced by the clock source 302 and the clock signal delay 310. Similarly, the ill or bit period of the data signal produced by the latch 350 is the inverse of the frequency of the clock signal produced by the clock source 302 and the clock signal delay 310 (i.e., equal to the duration of a cycle of the clock signal produced by the clock source 302 and the clock signal delay 310).

The latch 350 preferably includes a $D_{in}$ port 352, a $D_{out}$ port 354, and a $C_{in}$ port 356. The signal transmitted by the data signal delay 330 (e.g., a delayed data signal transmitted by the SERDES 120) is transmitted to the latch 350 through the $D_{in}$ port 352. A latched state of the data signal is then transmitted to the DCA 140 through the $D_{out}$ port 354. The clock signal transmitted by the clock signal delay 310 is transmitted to the latch 350 through the $C_{in}$ port 356.

The data signal output by the latch 350 may include jitter created by the clock source 302 and the latch 350. But the jitter performance of the latch 350 (and the clock source 302) is significantly better than that of the SERDES 120. And because of the timing adjustment of the clock signal and the data signal input to the latch 350, jitter created by the SERDES 120 is not transferred to the output of the latch 350.

As noted above, the microprocessor 150 typically comprises a computer processor on a microchip. The microprocessor 150 directs the operation of the SERDES 120, and may also configure the clock source 302, the clock signal delay 310, the frequency divider 320, and the data signal delay 330. Again, the microprocessor 150 completes these tasks, under the direction of the computer 160.

The microprocessor 150 preferably includes a first I/O port 152, a second I/O port 156, a first $D_{out}$ port 154, a second $D_{out}$ port 155, a third $D_{out}$ port 157, and a fourth $D_{out}$ port 158. The microprocessor 150 sends and receives data to and from the SERDES 120 and the computer 160 through the first and second I/O ports 156, 152, respectively. Additionally, the microprocessor 150 transmits configuration data to the data signal delay 330, clock signal delay 310, the frequency divider 320, and the clock source 302 through the first $D_{out}$ port 154, the second $D_{out}$ port 155, the third $D_{out}$ port 157, and the fourth $D_{out}$ port 158, respectively. Although separate ports are illustrated and discussed, some embodiments of the present invention may include fewer or just one port (comprised of several leads) to interact with the various components listed above.

Figure 3B:
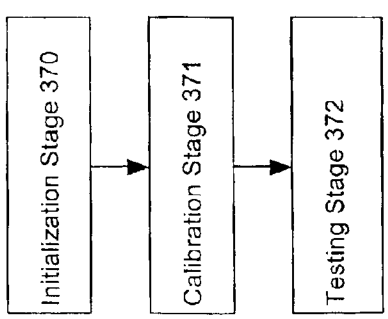
FIGS. 3B and 3C illustrate processing steps consistent with an embodiment of the present invention.

As indicated above generally, the control module 268 monitors and controls the microprocessor 150 and the DCA 140 through I/O ports 161, 162. In the present invention, the control module 268 is further configured to execute the initialization stage 370, calibration stage 371, and the testing stage 372 (FIG. 3B). To do so, the control module 268 directs the microprocessor 150—using standard techniques—to initialize one or more other components included in a BERT and, if need be, to obtain information about the one or more other components that are not connected directly to the computer 160. The control module 268 also engages in two-way communication with the microprocessor 150 during the calibration stage 371. The control module 268 initiates the calibration stage 371 and monitors the progress, in part, through the microprocessor 150. Additionally, the control module 268 engages in two-way communication with the DCA 140 to, for example, initiate jitter measurements by the DCA 140 and to obtain the results of such measurements. The control module 268 also interacts with the microprocessor 150 and the DCA 140 during the testing stage 372 to orchestrate testing of DUTs 130. The control module 268 may also communicate information about the various stages in progress or the final results of such stages through the user interface 264 as needed. Finally, the computer 160 typically communicates with the DCA 140 using a protocol such as the I.E.E.E. Std. 388.2-1992 or other similar protocol typically used by devices such as the DCA 140 for inter-device communication.

Referring now to FIG. 3B, there is shown a flow chart of stages including an initialization stage 370, a calibration stage 371, and a testing stage 372. The initialization stage 370 typically includes the microprocessor 150, under the control of the computer 160, configuring the clock source 302 and the frequency divider 320. More specifically, the control module 268 preferably directs the microprocessor 150, through the I/O port 162 and the I/O port 152, to set the clock frequency of the clock signal generated by the clock source 302. As described above, the microprocessor 150 transmits configuration data through its $D_{out}$ port 158 to the $D_{in}$ port 304 of the clock source 302. The control module 268 also preferably directs the microprocessor 150 to set the amount by which the frequency divider 320 divides the clock signal generated by the clock source 302. As described above, the microprocessor 150 transmits configuration data through its $D_{out}$ port 157 to the $D_{in}$ port 326 of the frequency divider 320. Finally, the configuration data transmitted in this stage may be stored in the microprocessor 150 so that the control module 268 selects the data to use or transmits the configuration data along with control signals to the microprocessor 150.

These configuration actions are included in the initialization stage 370 in this embodiment of the present invention because the configuration values are generally not changed or recalculated during the calibration stage 371, which is described below. These configuration actions, however, can be included in the calibration stage 371 as well, without departing from the scope of the present invention.

Figure 3C:
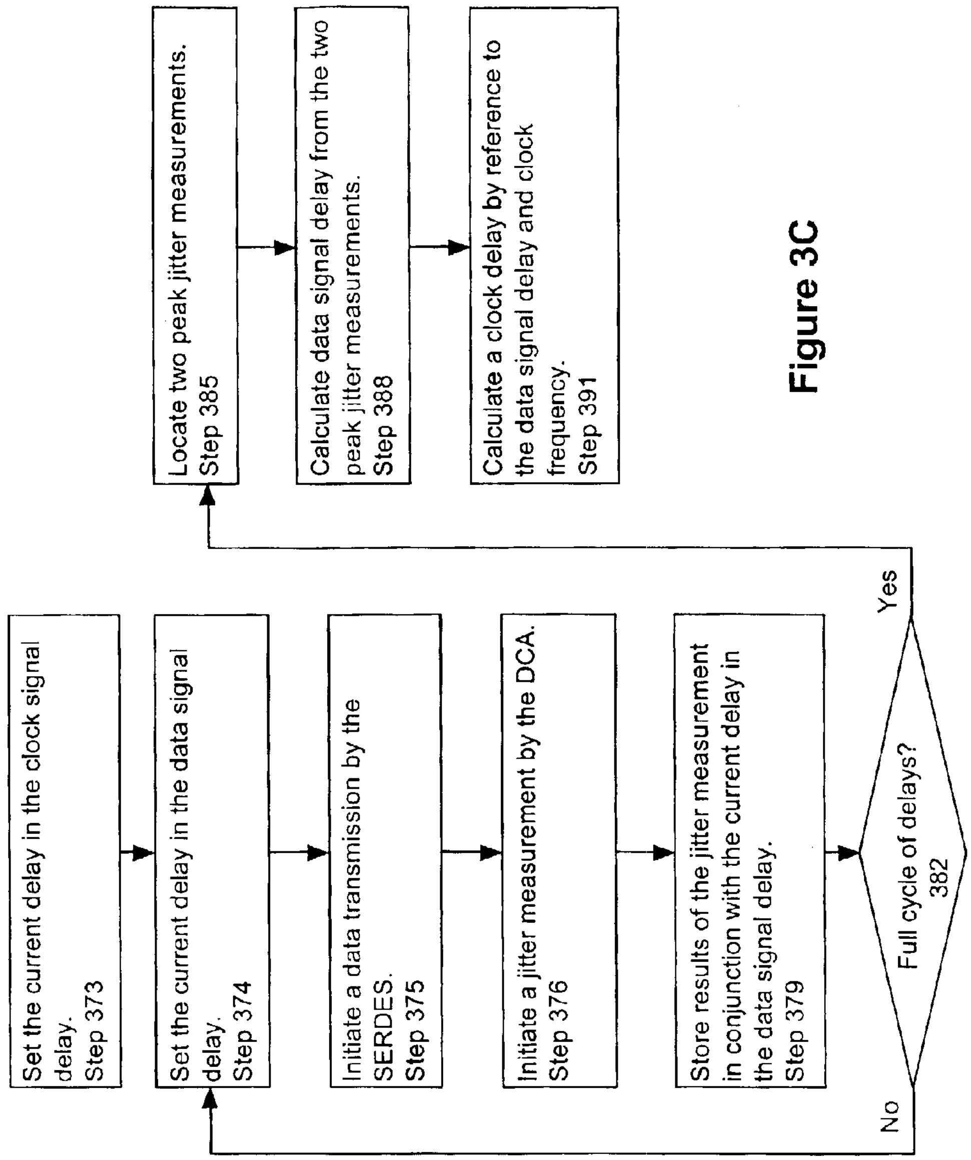

The various sub-steps included in the calibration stage 371 are described with reference to FIG. 3C. A first step includes setting the delay of the clock signal delay 310 (step 373). The control module 268 preferably directs the microprocessor 150 to set the programmable delay of the clock signal delay 310 to zero seconds. As described above, the microprocessor 150 transmits configuration data through its $D_{out}$ port 155 to the $D_{in}$ port 316 of the clock signal delay 310.

A next step includes setting the current delay of the data signal delay 330 (step 374). As described above, the microprocessor 150 interacts with the data signal delay 330 through its $D_{out}$ port 154 and the $D_{in}$ port 336 of the data signal delay 330 to set the programmable delay value of the data signal delay 330. In a preferred embodiment, the current delay starts at zero seconds and is increased in 10 picosecond increments until the current delay is approximately 2 UI of the data signal produced by the SERDES 120. In other embodiments the size of the increments ranges from 4 to 25 picoseconds. The frequency of the clock signal received by the latch 350 is ideally equal to the data rate of the data signal produced by the SERDES 120. In other words, 2 UI of the clock signal is equal in temporal duration to two bit periods or 2 UI of the data signal produced by the SERDES 120. And again, in some embodiments of the present invention, the data signal delay 330 has a fixed minimum delay. In these embodiments, the value of the current delay may be offset by the fixed minimum delay. Finally, the current delay transmitted in this step may be stored in the microprocessor 150 so that the control module selects the delay to use or transmits the current delay along with control signals to the microprocessor 150.

In a next step, a data transmission by the SERDES 120 is initiated (step 375). More specifically, the microprocessor 150, under the direction of the control module 268, interacts with the SERDES 120 through its I/O port 156 and the I/O port 128 of the SERDES 120 to initiate the generation and transmission of a data signal. In a preferred embodiment of the present invention, the data signal is a pseudorandom pattern comprised of $2^7$-1 bits. The data rate of the data signal produced by the SERDES 120 is an integer multiple of the frequency of the clock signal produced by the frequency divider 320. More specifically, the SERDES 120 preferably produces serial data at a data rate equal to the frequency of the clock signal produced by the clock source 302.

Additionally, the pseudorandom pattern is typically selected by the microprocessor 150, under the direction of the control module 268, during this step. The data signal transmitted by the SERDES 120 then passes through the data signal delay 330 subject to the delay set in step 374. The data signal is then transmitted to, and latched by, the latch 350. The timing of the latching is controlled by the clock signal transmitted to the latch 350 from the clock signal delay 310. More specifically, the latch 350 is preferably configured to latch a state from the data signal when the clock signal transitions to a high logic state. The latched state is then transmitted through the $D_{out}$ port 354 to the DCA 140 and may not change until another state is latched (e.g., when the clock signal next transitions to a high logic state).

In a next step, a jitter measurement by the DCA 140 is initiated (step 376). More specifically, the computer 160 interacts with the DCA 140 through its I/O port 161 and the I/O port 146 of the DCA 140 to initiate the jitter measurement. In a preferred embodiment of the present invention, peak-to-peak jitter is measured. In other embodiments of the present invention, RMS jitter is measured. After the completion of the jitter measurement by the DCA the result is transmitted back to the computer 160. In some embodiments of the present invention, the computer 160, or more specifically, the control module 268, periodically requests a status update for the jitter measurement. Once the status indicates that the jitter test is complete, the control module 268 requests the result.

In a next step, the results of the jitter measurement are stored in database 269 in conjunction with the current delay of the data signal delay 330 (step 379).

The control module 268 then, for example, analyzes the database 269 to determine whether there has been a full cycle of delays (step 382). In other words, the control module 268 determines whether the current delay has been incremented to a value approximately equal to 2 UI of the data signal produced by the SERDES 120. This determination can be made in any number of ways. For example, the control module 268 may analyze the current delay to determine whether it is approximately equal to 2 UI of the data signal produced by the SERDES 120. The control module 268 may also, for example, determine whether a defined number of iterations of steps 374–379 have occurred. This later way requires the control module 268 to determine in advance how many iterations are required to increment the value of the current delay to be approximately equal to 2 UI of the data signal produced by the SERDES 120.

If not (step 382-No), the microprocessor 150, under the direction of the control module 268, increments the current delay by a defined amount, possibly increments an iteration counter, and returns to step 374.

Figure 3D:
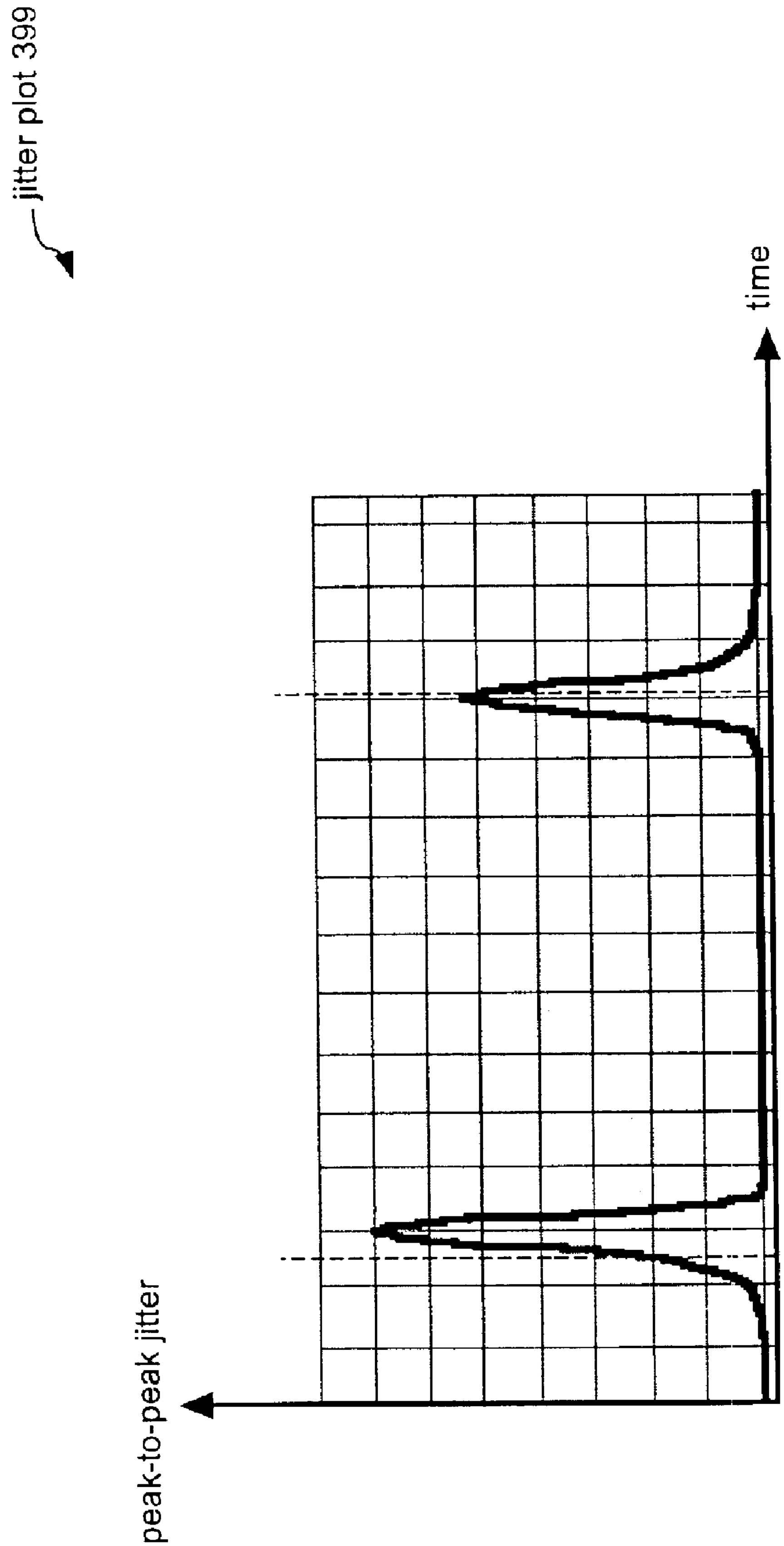
FIG. 3D is a jitter plot.

But if there has been a full cycle of delays (step 382-Yes), the control module 268 locates two peak jitter measurements (step 385). Referring to FIG. 3D, there is shown a jitter plot 399. The jitter plot 399 includes a plot of peak-to-peak jitter—measured by the DCA 140 and stored by the control module 268 in the database 269—against a corresponding "current" delay. As shown in the jitter plot 399, there are two distinct peak-to-peak jitter spikes ("jitter spikes"). These two jitter spikes typically correspond to the temporal boundaries of a bit period of a data signal. The two dashed lines included in FIG. 3D represent the ideal temporal boundaries of a bit period of the data signal (e.g., $t_{n\ ideal}$ and $t_{n+1\ ideal}$) Clearly, the two dashed lines do not pass through the apexes of the two jitter spikes. The apexes do not, therefore, necessarily correspond precisely with the temporal boundaries of a bit period of the data signal. This is due to the random nature of jitter.

The control module 268 can locate the two jitter spikes using a number of techniques. In one technique, the control module 268 scans the stored peak-to-peak measurements and current delays to locate the two greatest peak-to-peak measurements corresponding to current delays separated by approximately 1 UI of the data signal. Requiring this minimum difference between the two corresponding current delays prevents two measurements from the same jitter spike being selected.

In another technique, the control module 268 scans the stored peak-to-peak measurements and current delays to locate a transition to a jitter measurement above a certain threshold and then a transition to a jitter measurement below the threshold. Ideally, these two measurements roughly coincide with the rise and decline of a jitter spike. The control module 268 preferably adds the current delays associated with these two jitter measurements and divides the total by two to approximately locate the apex of the corresponding jitter spike. The control module 268 then continues to scan the stored peak-to-peak measurements and current delays to locate a second transition to a jitter measurement above the threshold and a second transition to a jitter measurement below the threshold. These two measurements roughly coincide with the rise and decline of a second jitter spike. The control module 268 preferably adds the current delays associated with these two jitter measurements and divides the total by two to approximately locate the apex of the corresponding jitter spike.

In a next step, a data signal delay is calculated from the two peak jitter measurements located in step 385 (step 388). In a preferred embodiment, this step includes adding and then dividing by two the calculated delays corresponding to the apexes of two jitter spikes. The result of this step is a data signal delay that corresponds to a sample time or data signal delay on the jitter plot 399 approximately halfway between the two jitter spikes illustrated therein. As noted above, the two jitter spikes roughly correspond to the temporal boundaries of a bit period of the data signal. Because the timing of transitions between two bit periods may deviate (due to jitter), the data signal (e.g., latch a data signal state) is sampled near the midway point of a bit period of the data signal. Doing so effectively eliminates the jitter created by the SERDES 120. The data signal delay calculated in step 388 will shift the data signal input to the latch 350—in relation to the clock signal input to the latch 350—such that the latch 350 latches a state of the data signal at the midway point of a bit period of the data signal.

In a final step of the calibration stage 371, a clock signal delay is calculated by reference to the data signal delay and the frequency of the clock signal generated by the clock source (step 391). As described above, the clock signal delay is preferably an integer multiple of the clock signal cycle duration that is closest to the data signal delay calculated in step 388.

Figure 4:
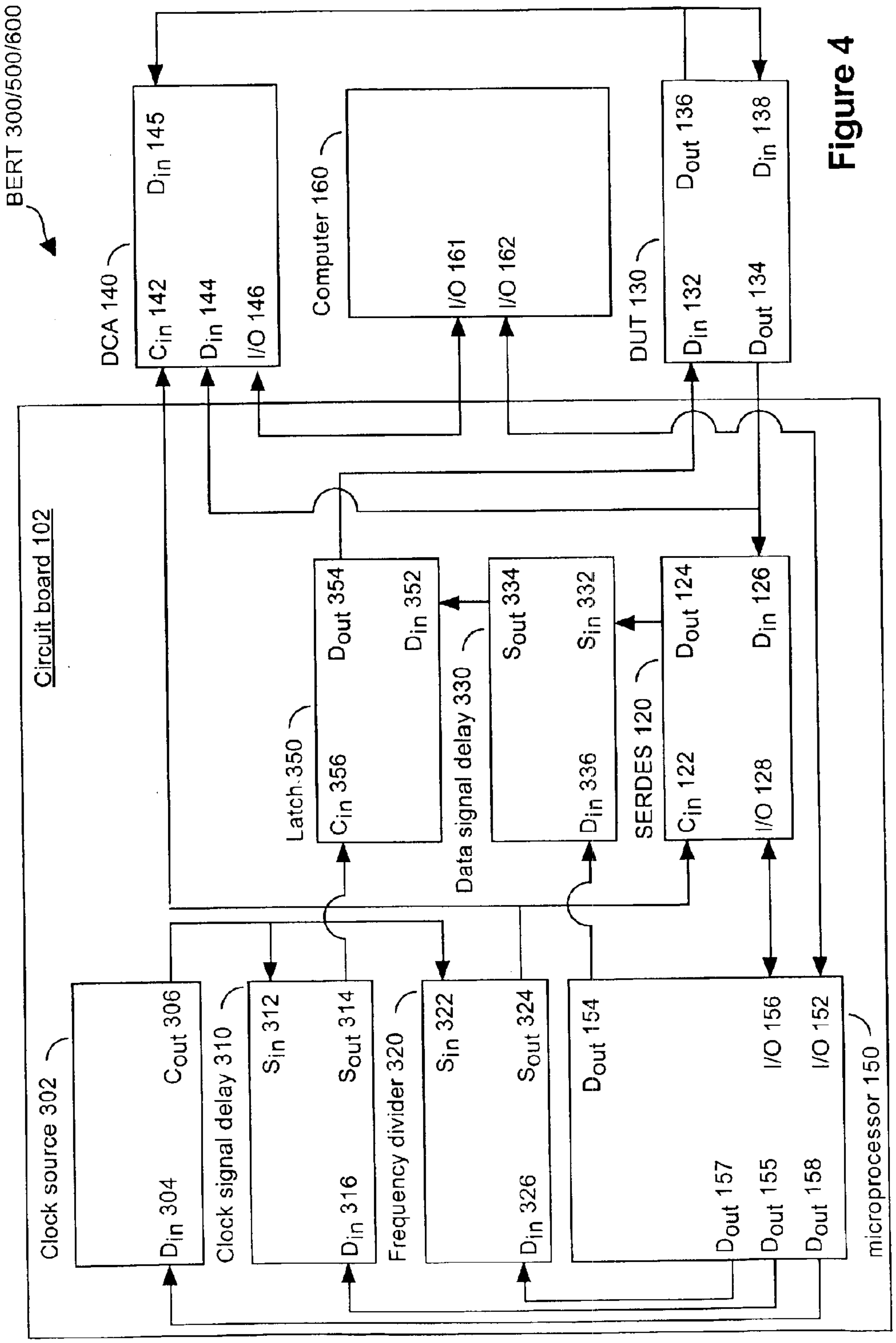
FIG. 4 is a block diagram of a BERT configured to test a device under test in a manner consistent with an embodiment of the present invention.

Referring back to FIG. 3B, the testing stage 372 typically includes the microprocessor configuring the clock signal delay 310 with the clock signal delay calculated in step 391 and configuring the data signal delay 330 with the data signal delay calculated in step 388. The BERT 300 may then be used to test a DUT 130 as illustrated in FIG. 4.

Similar to the steps taken in the calibration stage 371, the control module 268 initiates a data transmission by the SERDES 120 and the jitter measurement by the DCA 140. But unlike the calibration stage the output of the latch 350 is connected to the DUT 130 through the $D_{out}$ port 354 and the $D_{in}$ port 132. The DUT 130 then processes and transmits this output to the DCA 140 through the $D_{out}$ port 136 and to the SERDES 120 and the DCA 140 through the $D_{out}$ port 134. The DCA 140, therefore, performs jitter measurements on output of the DUT 130 instead of the latch 350. In particular, the DCA 140 may measure jitter included in a data signal output by the $D_{out}$ port 136 and/or jitter included in a data signal output by the $D_{out}$ port 134. Additionally, the SERDES 120 checks the data signal transmitted by the DUT 130 against a pattern for bit errors. The microprocessor 150 then obtains the jitter measurement(s) from the DCA 140 and bit error informnation from the SERDES 120 to determine whether the DUT 130 passed the test. Because of the system and method of the present invention described herein, jitter in the data signal produced by the SERDES 120 is unlikely to skew the results of the test.

Figure 5A:
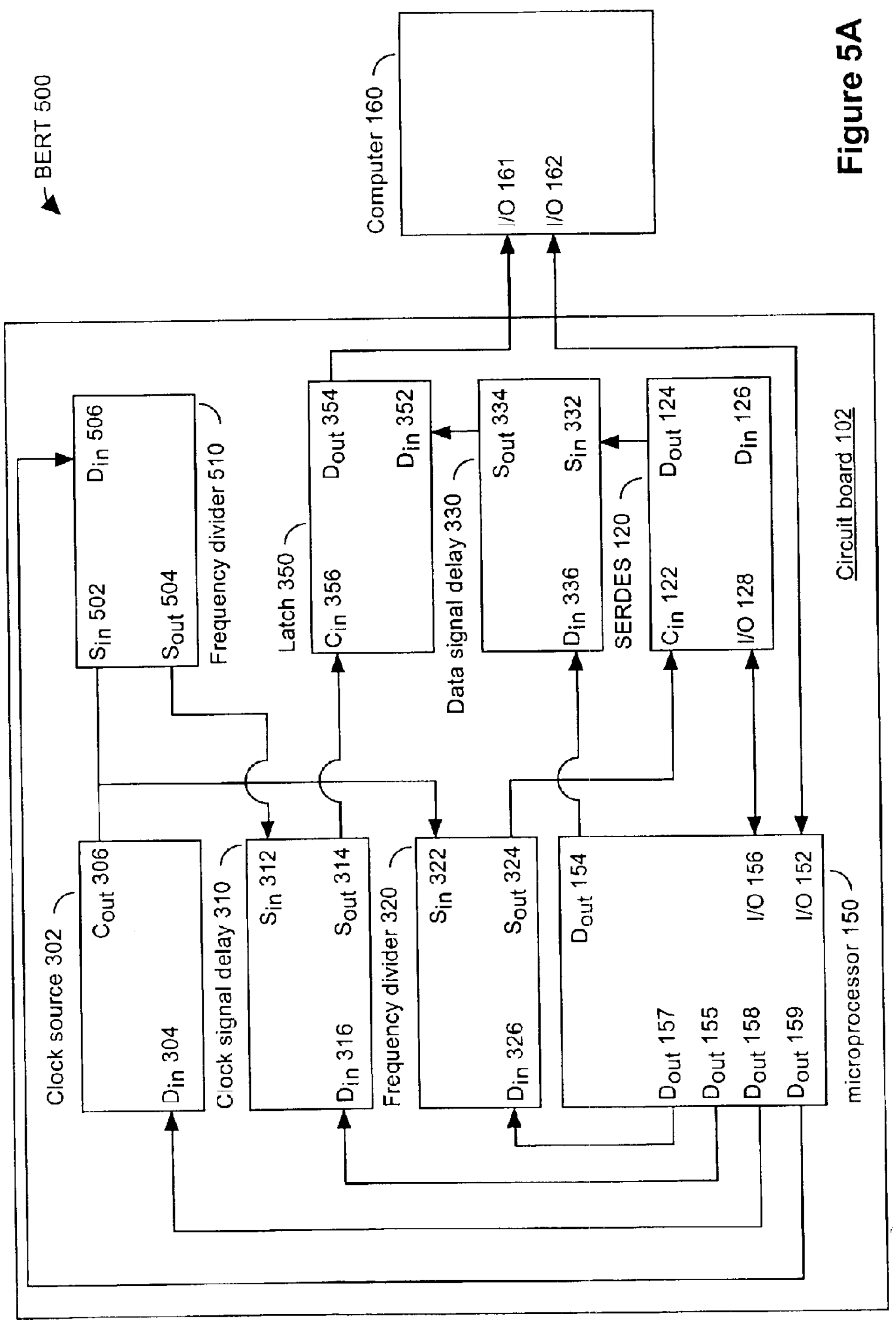
FIG. 5A is a block diagram of a BERT consistent with another embodiment of the present invention.

FIG. 5A illustrates a BERT 500 consistent with another embodiment of the present invention. This BERT 500 includes all of the components of the BERT 300 illustrated in FIG. 3A, with the exception of the DCA 140. BERT 500 also has an additional component, a second frequency divider 510.

The frequency divider 510 preferably comprises a programmable frequency divider circuit. Generally, a clock signal applied to an input of the frequency divider 510 is transmitted at an output of the frequency divider 510 at a fraction of the input frequency. The amount by which the clock signal frequency is divided is programmable using either a serial or parallel data input. The amount by which the clock signal frequency is divided is preferably one half. For example, if the frequency of the clock signal input to the frequency divider 510 is 10 GHz, the frequency of the clock signal output from the frequency divider 510 is 5 GHz.

The frequency divider 510 preferably includes an $S_{in}$ port 502, an $S_{out}$ port 504, and a $D_{in}$ port 506. The clock signal generated by the clock source 302 is transmitted to the frequency divider 510 through the $S_{in}$ port 502. The clock signal—after its frequency is divided—is transmitted to the clock signal delay 310 through the $S_{out}$ port 504. The microprocessor 150, under the direction of the control module 268, sets the amount by which the clock signal frequency is divided through the $D_{in}$ port 506, which functions as a control port. The connection to the $D_{in}$ port 506 includes one or more separate leads depending on the specific embodiment.

Figure 5B:
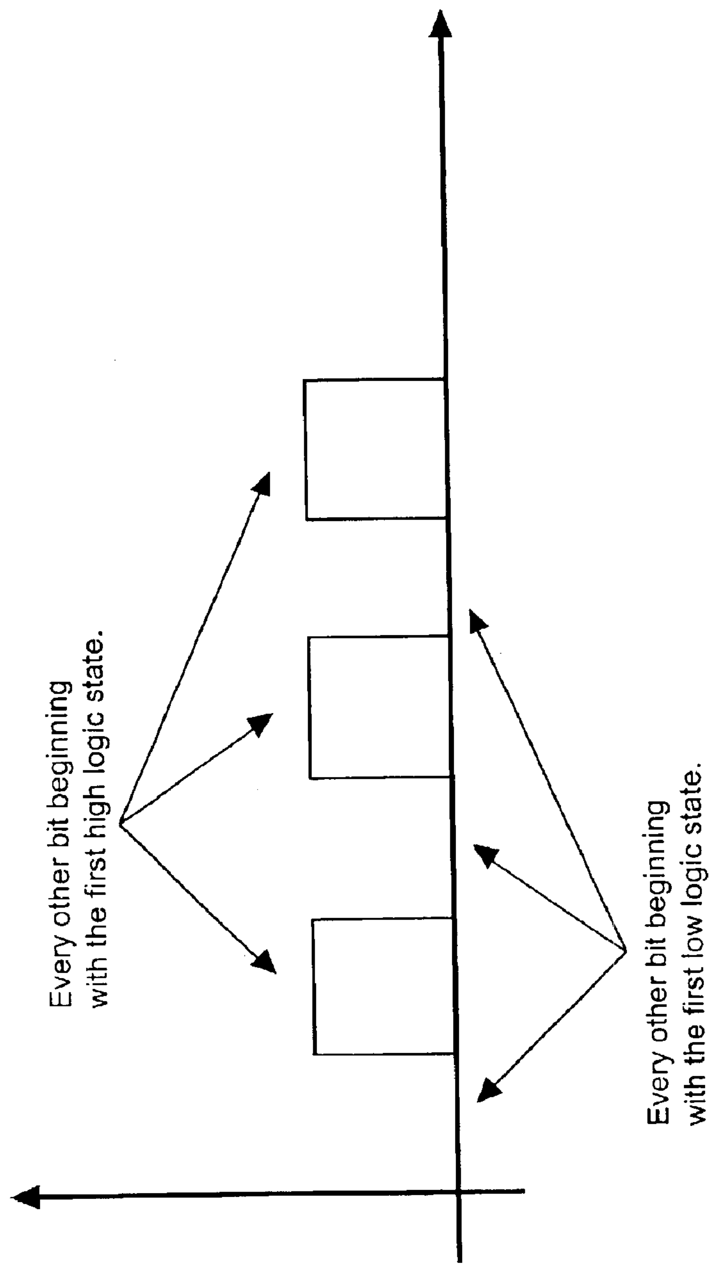
FIG. 5B illustrates a clock signal.

Because of the frequency divider, the data signal produced by the SERDES 120 is not sampled during consecutive bit periods. Instead, the data signal produced by the SERDES 120 is sampled during every other bit period. As described below, in this embodiment of the invention, the data signal produced by the SERDES 120 mimics a clock signal. In other words, every other bit of the data signal should match as illustrated in FIG. 5B. One series of every other bit period begins with a low logic state and the other begins with a high logic state. It will become clear that the particular series processed in this embodiment of the present invention is irrelevant since it is only state changes—rather than state content—that are of value.

The microprocessor 150 illustrated in FIG. 5A, is essentially identical to the microprocessor 150 illustrated in FIG. 3A. But as indicated in the preceding paragraph, the microprocessor 150 of the BERT 500 illustrated in FIG. 5A also includes an additional port to communicate with the second frequency divider 510. More specifically, the microprocessor 150 preferably includes a $D_{out}$ port 159 that the microprocessor 150 use to transmit configuration data to the frequency divider 510.

Referring to FIG. 3B again, there is shown a flow chart of stages including an initialization stage 370, a calibration stage 371, and a testing stage 372. The initialization stage 370, with respect to this embodiment of the present invention, is essentially unchanged from the description provided above. However, the control module 268 preferably directs the microprocessor 150 to take the additional step of configuring the frequency divider 510. More specifically, the microprocessor 150, under the direction of the control module 268, preferably sets the amount by which the frequency divider 510 divides the clock signal generated by the clock source 302. As described above, the microprocessor 150 transmits configuration data through its $D_{out}$ port 159 to the $D_{in}$ port 506 of the frequency divider 510.

This additional configuration action is included in the initialization stage 370 in this embodiment of the present invention because the configuration value is generally not changed or recalculated during the calibration stage 371. This configuration action, however, can be included in a calibration stage as well, without departing from the scope of the present invention.

Figure 5C:
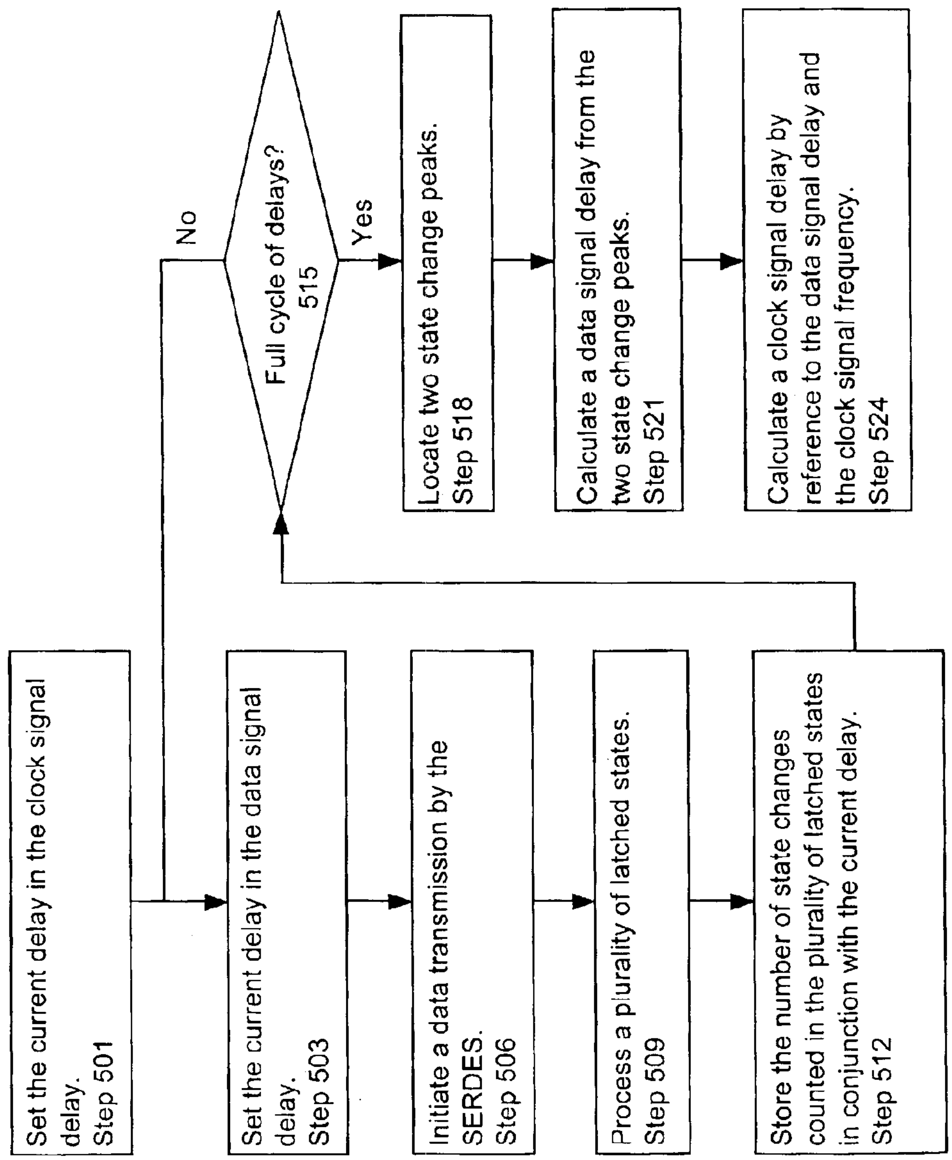
FIG. 5C illustrates processing steps consistent with another embodiment of the present invention.

The various sub-steps included in the calibration stage 371 of this embodiment of the present invention are described with reference to FIG. 5C. A first step includes setting the delay of the clock signal delay 310 (step 501). The control module 268 preferably directs the microprocessor 150 to set the programmable delay of the clock signal delay 310 to zero seconds. As described above, the microprocessor 150 transmits configuration data through its $D_{out}$ port 155 to the $D_{in}$ port 316 of the clock signal delay 310.

A next step includes setting the current delay of the data signal delay 330 (step 503). The microprocessor 150 interacts with the data signal delay 330 through its $D_{out}$ port 154 and the $D_{in}$ port 336 of the data signal delay 330 to set the programmable delay value of the data signal delay 330. In a preferred embodiment, the current delay starts at zero seconds and is increased in 10 picosecond increments until the current delay is approximately equal to 2 UI of the data signal produced by the SERDES 120. Again, in some embodiments of the present invention, the data signal delay 330 has a fixed minimum delay. In these embodiments, the value of the current delay may be offset by the fixed minimum delay.

In a next step, a data transmission by the SERDES 120 is initiated (step 506). More specifically, the microprocessor 150, under the direction of the control module 268, interacts with the SERDES 120 through its I/O port 156 and the I/O port 128 of the SERDES 120 to initiate the generation and transmission of a data signal. In a preferred embodiment of the present invention, the data signal mimics a clock signal (e.g., a series of alternating states). As described above, the data rate of the data signal produced by the SERDES 120 is a integer multiple of the frequency of the clock signal produced by the frequency divider 320. Additionally, the pattern of the data signal is typically selected by the microprocessor 150, under the direction of the control module 268, during this step. The data signal transmitted by the SERDES 120 then passes through the data signal delay 330, subject to the delay set in step 503. The data signal is then transmitted to, and latched by, the latch 350. The timing of the latching is controlled by the clock signal transmitted to the latch 350 from the clock signal delay 310. More specifically, the latch 350 is preferably configured to latch a value (e.g., a state) from the data signal when the clock signal transitions to a high logic state. The latched state is then transmitted through the $D_{out}$ port 354 to the I/O port 161 of the computer 160 and does not change until another state is latched (e.g., when the clock signal next transitions to a high logic state).

In a next step, a plurality of sampled states are processed (step 509) The control module 268 preferably generates a count of state changes by comparing the previous state of the latch 350 output (e.g., the previous state transmitted through the $D_{out}$ port 354) against the current state of the latch 350 output. If the current state of the latch 350 output does not match the previous state of the latch 350 output, the count of state changes is incremented. More specifically, the control module 268 initializes the count of state changes to zero and temporarily stores the current state (e.g., the first state processed by the control module 268). This state is then compared to the next current state of the latch 350 output (e.g., the second state processed by the control module 268). Again, if the current state of the latch 350 output does not match the previous state of the latch 350 output, the count of state changes is incremented. The control module 268 then overwrites the previous current state of the latch 350 with the current state of the latch 350. This process may be repeated for each state latched by the latch 350 or just a subset of these states—so long as enough samples are processed to accurately analyze the data transmission. In a preferred embodiment, at least one million sample states are processed by the control module 268.

Because the data signal is a repeating pattern of high and low logic states, and every other bit period should have the same state, there are ideally no state changes. But as noted above, if a data signal is sampled near a temporal boundary of a bit period, it is possible that, because of jitter, the state of the bit might not be interpreted as intended (e.g., a bit error occurs). The state of the data signal may have, for example, changed too soon or too late for the sampling device (e.g., the latch 350) to evaluate the intended state of the data signal. As the sample time draws closer to a temporal boundary of a bit period (e.g., as the difference between the time at which the clock signal received by the latch 350 transitions to a high logic state and $t_{ideal}$, which is described above, approaches zero), the effects of jitter tend to become more pronounced, as illustrated by the jitter plot in FIG. 3D, so that more state changes occur. Thus, without measuring jitter directly, this embodiment of the present invention is able to measure an effect of jitter.

After processing a subset or all of the latched states, the control module 268 stores the count of state changes in conjunction with the current delay, which was set in step 503, in the database 269 (step 512).

The control module 268 then determines whether there has been a sufficient number of delays (step 515). In other words, the control module 268 determines whether the current delay has been incremented to a value approximately equal to 2 UI of the data signal produced by the SERDES 120. As described above in connection with step 382 of FIG. 3C, this determination can be made in any number of ways.

If not (step 515-No), the microprocessor 150, under the direction of the control module 268, increments the current delay by a defined amount, possibly increments an iteration counter, and returns to step 503.

But if there has been a sufficient number of delays (step 515-Yes), the control module 268 locates two state change peaks (e.g., a delay associated with a high number of state changes, a jitter spike, and/or a temporal boundary of a bit period) (step 518). The control module 268 may locate the two state change peaks in any number of ways without departing from the scope of the present invention. In a preferred embodiment, the control module 268 begins by sequentially scanning the stored state change counts and current delays for a first current delay, which corresponds to a state change count below a defined threshold. The scanning preferably begins with the minimum current delay and ends with the maximum current delay. After locating the first current delay, scanning continues for a second current delay, which corresponds to a state change count above the defined threshold.

As indicated above, jitter spikes, such as those illustrated in FIG. 3D, correspond to temporal boundaries of bit periods. As a result, sample times close to a temporal boundary of a bit period are more likely to be affected by jitter. An effect of jitter in this embodiment of the invention on samples taken at times close to a temporal boundary of a bit period is a relatively high number of unintended state changes (as compared to, for example, samples taken at times close to midway between the temporal boundaries of a bit period). The threshold is preferably selected, therefore, so that an equal or greater state change count is indicative of a sample taken near a temporal boundary of a bit period (e.g., a sample time or current delay that corresponds to a jitter spike). Similarly, the threshold is preferably selected so that it is unlikely that the state change count of subsequent current delays will drop below the threshold until after the apex of the corresponding jitter spike has passed. This last requirement prevents small increases in jitter, which might not be associated with a temporal boundary of a bit period, from being misinterpreted as a jitter spike. As illustrated in FIG. 3D, at least a small amount of jitter exists throughout a bit period.

Additionally, the increment used to adjust the current delay in step 503 is preferably small enough so that at least one current delay corresponds to the rise of a jitter spike and at least one current delay corresponds to the decline of a jitter spike. As a result, the second current delay ideally corresponds to the rise of a jitter spike.

After finding the second current delay, scanning continues for a third current delay, which corresponds to a state change count below the defined threshold. And ideally, the third current delay corresponds to a sample time just after the decline of a jitter spike. In some embodiments of the present invention, the third current delay is reduced by the amount by which the current delay is incremented in step 503 to obtain the last current delay that corresponds to a sample time on the decline of the jitter spike.

After finding the second and third current delays (e.g., a first jitter spike), the control module 268 continues scanning for a fourth and fifth current delay (e.g., a second jitter spike). The fourth current delay is the next current delay corresponding to a state change count above the defined threshold. Additionally, the fifth current delay is the next current delay—following the fourth current delay—corresponding to a state change count below the defined threshold. Like the third current delay, the fifth current delay may be reduced by the amount by which the current delay is incremented in step 503 to obtain the last current delay that corresponds to a sample time on the decline of the jitter spike.

After the second, third, fourth, and fifth current delays are located (e.g., two state change peaks have been located), they are summed and divided by four (step 521). The result is a data signal delay that corresponds to a sampling position roughly midway between the temporal boundaries of a bit period (e.g., the apexes of the two jitter spikes illustrated in FIG. 3D). As noted above, this position is relatively unaffected by jitter, and is the best position at which to sample the data signal produced by the SERDES 120.

In a final step of the calibration stage 371, a clock signal delay is calculated by reference to the data signal delay and the frequency of the clock signal generated by the clock source (step 524). As described above, the clock signal delay is preferably an integer multiple of the clock signal cycle duration that is closest to the data signal delay calculated in step 521.

Referring back to FIG. 3B, the testing stage 372 typically includes the microprocessor 150, under the direction of the control module 268, configuring the clock signal delay 310 with the clock signal delay calculated in step 524 and configuring the data signal delay 330 with the data signal delay calculated in step 521. The BERT 500, without the frequency divider 510, may then be used to test a DUT 130 as illustrated in FIG. 4 and described in detail above.

Figure 6A:
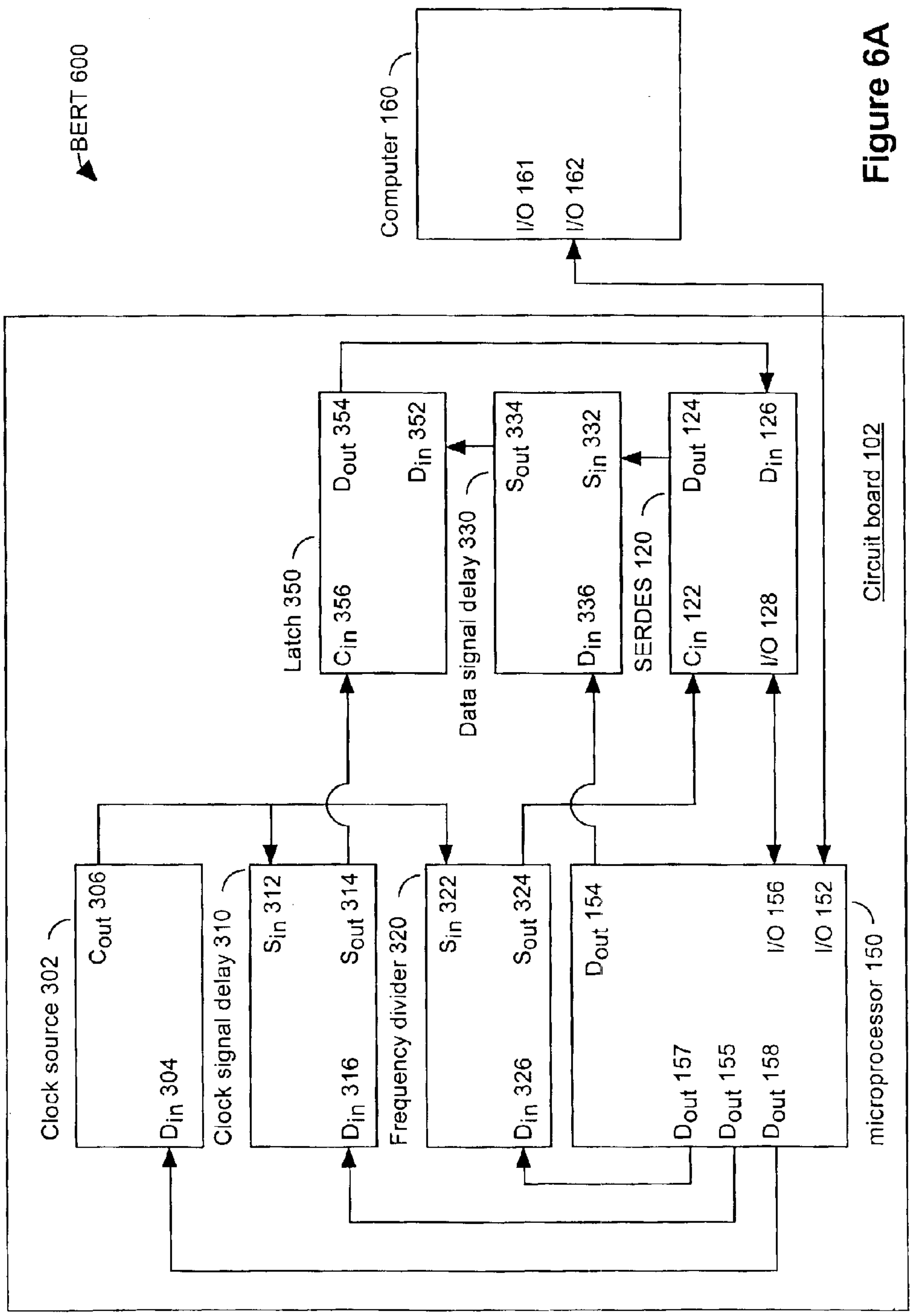
FIG. 6A is a block diagram of a BERT consistent with yet another embodiment of the present invention.

FIG. 6A illustrates a BERT 600 consistent with another embodiment of the present invention. This BERT 600 includes all of the components of the BERT 300 illustrated in FIG. 3A, with the exception of the DCA 140, which is not used in this embodiment of the present invention. As a result, the configuration of the BERT 600 is different than the configuration of the BERT 300. In particular, the $D_{in}$ port 354 of the latch 350 is electrically connected to the $D_{in}$ port 126 of the SERDES 120 instead of the I/O port 144 of the DCA 140.

Referring to FIG. 3B again, there is shown a flow chart of stages including an initialization stage 370, a calibration stage 371, and a testing stage 372. The initialization stage 370, with respect to this embodiment of the present invention, is essentially unchanged from the description provided above with respect to FIGS. 3A.

Figure 6B:
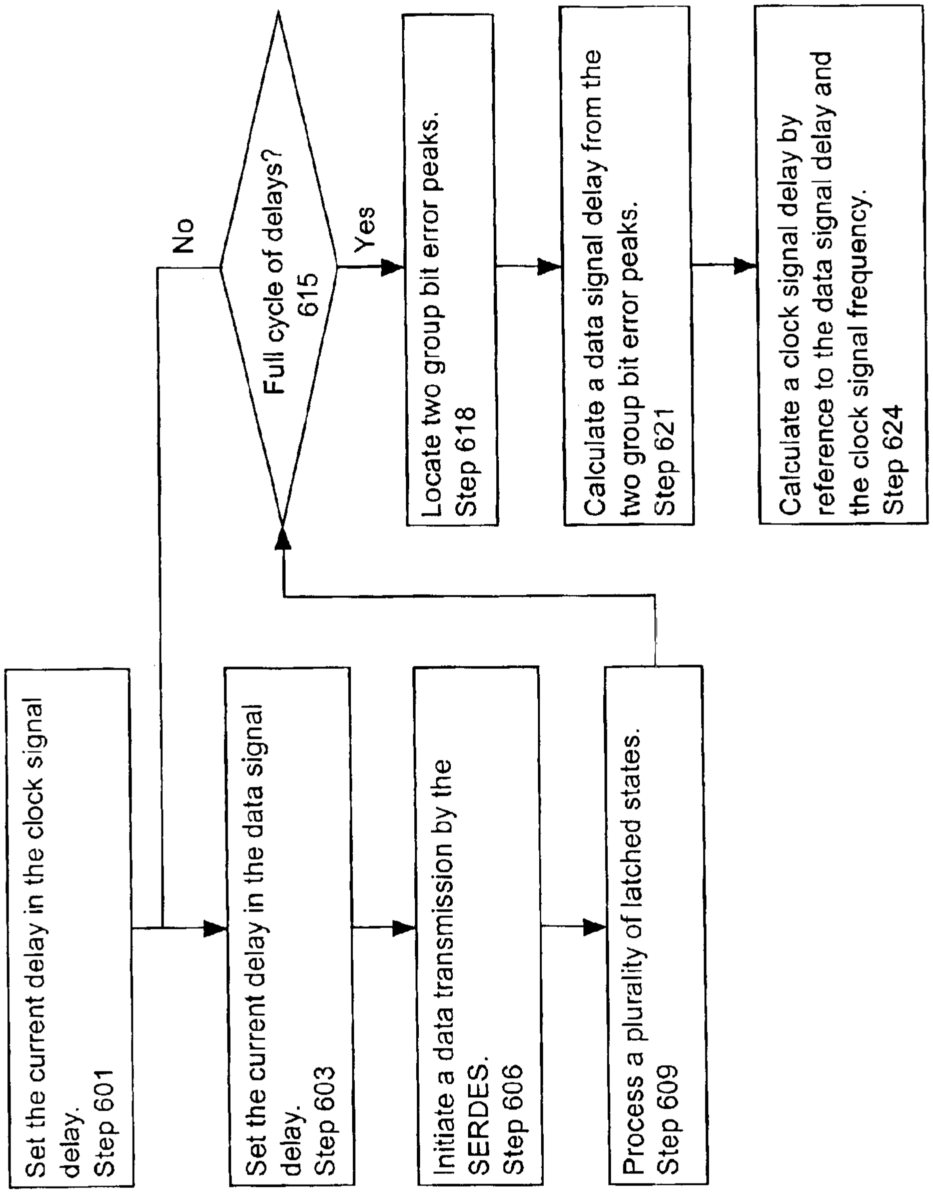
FIG. 6B illustrates processing steps consistent with yet another embodiment of the present invention.

The various sub-steps included in the calibration stage 371 of this embodiment of the present invention are, however, different from those described above and with reference to FIG. 6B. A first step includes setting the delay of the clock signal delay 310 (step 601). The control module 268 preferably directs the microprocessor 150 to set the programmable delay of the clock signal delay 310 to zero seconds. As described above, the microprocessor 150 transmits configuration data through its $D_{out}$ port 155 to the $D_{in}$ port 316 of the clock signal delay 310.

A next step includes setting the current delay of the data signal delay 330 (step 603). The microprocessor 150 interacts with the data signal delay 330 through its $D_{out}$ port 154 and the $D_{in}$ port 336 of the data signal delay 330 to set the programmable delay value of the data signal delay 330. In a preferred embodiment, the current delay starts at zero seconds and is increased in 10 picosecond increments until the current delay is approximately equal to 2 UI of the data signal produced by the SERDES 120. Again, in some embodiments of the present invention, the data signal delay 330 has a fixed minimum delay. In these embodiments, the value of the current delay may be offset by the fixed minimum delay.

In a next step, a data transmission by the SERDES 120 is initiated (step 606). More specifically, the microprocessor 150, under the direction of the control module 268, interacts with the SERDES 120 through its I/O port 156 and the I/O port 128 of the SERDES 120 to initiate the generation and transmission of a data signal. In a preferred embodiment of the present invention, the data signal is a pseudorandom pattern comprised of $2^7$-1 bits. As described above, the data rate of the data signal produced by the SERDES 120 is an integer multiple of the frequency of the clock signal produced by the frequency divider 320. Additionally, the pattern of the data signal is typically selected by the microprocessor 150, under the direction of the control module 268, during this step. The data signal transmitted by the SERDES 120 then passes through the data signal delay 330, subject to the delay set in step 603. The data signal is then transmitted to, and latched by, the latch 350. The timing of the latching is controlled by the clock signal transmitted to the latch 350 from the clock signal delay 310. More specifically, the latch 350 is preferably configured to latch a value (e.g., a state) from the data signal when the clock signal transitions to a high logic state. The latched state is then transmitted through the $D_{out}$ port 354 to the $D_{in}$ port 126 of the SERDES 120 and may not change until another state is latched (e.g., when the clock signal next transitions to a high logic state).

In a next step, a plurality of sample states are processed (step 609). Because the SERDES 120 generated the pattern, which is not truly random, the SERDES 120 can detect when a bit error occurs. When an error is detected by the SERDES 120, an error bit of the I/O port 128 is set. Typically, the SERDES 120 processes received data in bit groups, so each time this error bit is set, one or more of the bits in a bit group is in error. The microprocessor 150 is configured to transmit the state of the error bit to the control module 268 of the computer 160. The control module 268 maintains data in the database 269 for each of the current delays. More specifically, a count of bit group errors is maintained for each current delay and initialized to zero. Each time the error bit is set to indicate a bit group error, a corresponding count of bit group errors is incremented by the control module 268. Finally, the control module 268 maintains the current delay in conjunction with the count of bit group errors for subsequent analysis.

The control module 268 then determines whether there has been a sufficient number of delays (step 615). In other words, the control module 268 determines whether the current delay has been incremented to a value approximately equal to 2 UI of the data signal produced by the SERDES 120.

If not (step 615-No), the microprocessor 150, under the direction of the control module 268, increments the current delay by a defined amount, possibly increments an iteration counter, and returns to step 603.

But if there has been a sufficient number of delays (step 615-Yes), the control module 268 locates two bit group error peaks (e.g., a delay associated with a high number of bit group errors, a jitter spike, and/or a temporal boundary of a bit period) (step 618). The control module 268 may locate the two bit group error peaks in any number of ways without departing from the scope of the present invention. In a preferred embodiment, step 618 is performed in the same was as step 518, as described above. The only notable difference is that step 618 scans and processes stored bit group error counts instead of the state change counts processed by step 518. After the second, third, fourth, and fifth current delays are located (e.g., two bit group error peaks have been located), they are summed and divided by four (step 621). The result is a data signal delay that corresponds to a position roughly midway between the temporal boundaries of a bit period (e.g., the apexes of the two jitter spikes illustrated in FIG. 3D). As noted above, this position is relatively unaffected by jitter, and is the best position at which to sample the data signal produced by the SERDES 120.

In a final step of the calibration stage, a clock signal delay is calculated by reference to the data signal delay and the frequency of the clock signal generated by the clock source (step 624). As described above, the clock signal delay is preferably an integer multiple of the clock signal cycle duration that is closest to the data signal delay calculated in step 621.

Referring back to FIG. 3B, the testing stage 372 typically includes the microprocessor 150, under the direction of the control module 268, configuring the clock signal delay 310 with the clock signal delay calculated in step 624 and configuring the data signal delay 330 with the data signal delay calculated in step 621. The BERT 600 may then be used to test a DUT 130 as illustrated in FIG. 4 and described above in detail.

While preferred embodiments of the present invention have been disclosed, it will be understood that in view of the foregoing description, other configurations can provide one or more of the features of the present invention, and all such other configurations are contemplated to be within the scope of the present invention. Accordingly, it should be clearly understood that the embodiments of the invention described above are not intended as limitations on the scope of the invention, which is defined only by the claims that are now or may later be presented.

What is claimed is:

1. A system for processing a data signal comprising:

a first circuit configured to generate a first data signal based on a pattern, said first data signal including variations from the pattern, said first data signal transmitted at a first frequency;

a second circuit configured to generate a second data signal by delaying the first data signal by a first amount of time, said first amount of time subject to a series of adjustments;

a third circuit configured to latch states of the second data signal;

a fourth circuit configured to take measurements of the variations from the pattern by reference to the states of the second data signal following each adjustment in the series of adjustments;

a fifth circuit configured to receive the measurements of the variations from the pattern from the fourth circuit, said fifth circuit further configured to:

control the series of adjustments so that a measurement of a first spike of said variations is received from said fourth circuit, said first spike corresponding to a first delay;

control the series of adjustments so that a measurement of a second spike of said variations is also received from said fourth circuit, said second spike corresponding to a second delay; and set said first amount of time to a third delay derived from said first delay and said second delay.

2. The system of claim 1, wherein:

the first data signal comprises a pseudorandom combination of transitions between two logic states, said transitions between two logic states are spaced apart by a second amount of time; and the variations comprise deviations from the second amount of time.

3. The system of claim 1, wherein controlling the series of adjustments includes initializing the first amount of time to zero seconds.

4. The system of claim 1, wherein controlling the series of adjustments includes adjusting the first amount of time by a predefined amount of time until the first amount of time is approximately equal to two cycles of the second data signal.

5. The system of claim 1, wherein:

the fifth circuit is configured to scan a plurality of measurements taken by the fourth circuit for the first spike of said variations, said first spike of said variations corresponding to variations from the pattern that exceed a threshold variation, each measurement of said plurality of measurements corresponding to a separate adjustment of the first amount of time; and the fifth circuit is configured to continue to scan the plurality of measurements taken by the fourth circuit for the second spike of said variations said second spike of said variations corresponding to variations from the pattern that exceed the threshold variation.

6. The system of claim 1, wherein the fifth circuit is configured to locate the first spike of the variations and the second spike of said variations by:

adjusting the first amount of time until a measurement of said first spike of said variations is received from the fourth circuit; and continuing to adjust said first amount of time until a measurement of said second spike of said variations is received from said fourth circuit.

7. The system of claim 1, wherein the third delay corresponds to an average of the first delay and the second delay.

8. A method of processing a data signal, comprising:

generating a first data signal based on a pattern, said first data signal including variations from the pattern said first data signal transmitted at a first frequency;

generating a second data signal by delaying the first data signal by an amount of time, said amount of time subject to a series of adjustments;

latching states of the second data signal;

taking measurements of the variations from the pattern by reference to the states of the second data signal for each adjustment in the series of adjustments;

controlling the series of adjustments so that a measurement of a first spike of said variations is taken, said first spike corresponding to a first delay;

controlling the series of adjustments so that a measurement of a second spike of said variations is also taken, said second spike corresponding to a second delay; and setting said amount or time to a third delay derived from said first delay and said second delay.

9. The method of claim 8, wherein controlling the series of adjustments includes initializing the amount of time to zero seconds.

10. The method of claim 8, wherein controlling the series of adjustments includes adjusting the amount of time by a redefined amount of time until the amount of time is approximately equal to two cycles of the second data signal.

11. The method of claim 8, further comprising:

scanning a plurality of measurements for the first spike of said variations, said first spike of said variations corresponding to variations from the pattern that exceed a threshold variation, each measurement of said plurality of measurements corresponding to a separate adjustment of the amount of time; and continuing to scan the plurality of measurements for the second spike of said variations, said second spike of said variations corresponding to variations from the pattern that exceed the threshold variation.

12. The method of claim 8, wherein controlling the series of adjustments includes:

adjusting the amount of time until a measurement of said first spike of said variations is taken; and continuing to adjust said amount of time until a measurement of said second spike of said variations is taken.

13. The method of claim 8, comprising deriving the third delay from the first delay and the second delay by averaging said first delay and said second delay.

14. A system for processing a data signal, comprising:

a first circuit configured to transmit a first data signal, said first data signal including a series of transitions between a first logic state and a second logic state, said first data signal including variations from an ideal timing of each transition in said series of transitions;

a second circuit configured to generate a second data signal by delaying the first data signal by an amount of time;

a third circuit configured to latch a logic state of the second data signal at a frequency less than that of said second data signal;

a fourth circuit configured to:

incrementally adjust the amount of time until a total of the adjustments corresponds to said frequency less than that of said second data signal;

prompt the first circuit to transmit the first data signal following each adjustment of the amount of time;

process a plurality of latched logic states for each first data signal transmitted;

identify one of said each first data signal transmitted that includes a first peak of unintended state changes, said one corresponding to a first adjusted value of the amount of time;

identify another of said each first data signal transmitted that includes a second peak of unintended state changes, said another corresponding to a second adjusted value of the amount of time; and set said amount of time to an ideal value said ideal value derived from the first adjusted value and the second adjusted value.

15. The system of claim 14, wherein the ideal value is derived by averaging said first adjusted value and said second adjusted value.

16. The system of claim 14, wherein said frequency less than that of said second data signal is approximately equal to one half of a frequency of said second data signal; and the total of the adjustments is approximately equal in duration to two cycles of said second data signal.

17. A method for processing a data signal, comprising transmitting a first data signal with a first circuit, said first data signal including a series of transitions between a first logic state and a second logic state, said first data signal including variations from an ideal timing of each transition in said series of transitions;

generating a second data signal by delaying the first data signal by an amount of time;

latching a logic state of the second data signal at a frequency less than that of said second data signal;

incrementally adjusting the amount of time until a total of the adjustments corresponds to said frequency less than that of said second data signal;

prompting the first circuit to transmit the first data signal following each adjustment of the amount of time;

processing a plurality of latched logic states for each first data signal transmitted;

identifying one of said each first data sign transmitted that includes a first peak of unintended state changes, said one corresponding to a first adjusted value of the amount of time;

identifying another of said each first data signal transmitted that includes a second peak of unintended state changes, said another corresponding to a second adjusted value of the amount of time; and setting said amount of time to an ideal value, said ideal value derived from the first adjusted value and the second adjusted value.

18. The method of claim 17, wherein the ideal value is derived by averaging said first adjusted value and said second adjusted value.

19. The method of claim 17, wherein said frequency less than of said second data signal is approximately equal to one half of a frequency of said second data signal; and the total of the adjustments is approximately equal in duration to two cycles of said second data signal.

20. A system for processing a data signal comprising:

a first circuit configured to transmit a first data signal, said first data sign including a series of transitions between a first logic state and a second logic state, said first data signal including variations from an ideal timing of each transition in said series of transitions;

a second circuit configured to generate a second data signal by delaying the first data signal by an amount of time;

a third circuit configured to latch logic states of the second data signal; the first circuit configured to process logic states latched by the third circuit by determining a count of latched logic states in error;

a fourth circuit configured to:

incrementally adjust the amount of time;

prompt the first circuit to transmit the first data signal following each adjustment of the amount of time;

process the count of logic states in error for each first data signal transmitted;

identify one of said each first data signal transmitted that includes a first peak of logic states in error, said one corresponding to a first adjusted value of the amount of time;

identify another of said each first data signal transmitted that includes a second peak of logic states in error, said another corresponding to a second adjusted value of the amount of time; and set said amount of time to an ideal value, said ideal value derived from the first adjusted value and the second adjusted value.

21. The system of claim 20, wherein the ideal value is derived by averaging said adjusted value and said second adjusted value.

22. The system of claim 20, wherein the amount of time is incrementally adjusted until a total of the adjustments is approximately equal in duration to two cycles of said second data signal.

23. A method for processing a data signal, comprising transmitting a first data signal, said first data signal including a series of transitions between logic states that a first logic state and a second logic state, said first data signal including variations from an ideal timing of each transition in said series of transitions;

generating a second data signal by delaying the first data signal by an amount of time;

latching logic states of the second data signal;

determining a count of latched logic states in error by reference to the logic states;

incrementally adjusting the amount of time;

prompting the transmission of the first data signal following each adjustment of the amount of time;

processing the count of latched logic states in error for each first data signal transmitted;

identifying one of said each first data signal transmitted that includes a first peak of latched logic states in error, said one corresponding to a first adjusted value of the amount of time; identifying another of said each data signal transmitted that includes a second peak of latched logic states in error, said another corresponding to a second adjusted value of the amount of time; and setting said amount of time to an ideal value, said ideal value derived from the first adjusted value and the second adjusted value.

24. The method of claim 23, wherein the ideal value is derived by averaging said first adjusted value and said second adjusted value.

25. The method of claim 23, wherein the amount of time is incrementally adjusted until a total of the adjustments is approximately equal in duration to two cycles of said second data signal.

26. A system for testing an electronic device, comprising:

a first circuit configured to transmit a first data signal, said first data signal including transitions between a first logic state and a second logic state, said first data signal including Variations from an ideal timing of the transitions;

a second circuit configured to generate a second data signal by delaying the first data signal by an ideal amount of time;

a third circuit configured to latch logic states of the second data signal in response to state transitions in a received clock signal, said latched logic states received by an electronic device under test;

the first circuit receiving from the electronic device under test a data signal derived from the latched logic states of the second data signal, said first circuit configured to determine whether the the latched logic states of the second data signal is consistent with the first data signal; and an ideal delay being derived so that the state transitions in the received clock signal occur substantially midway between temporal boundaries of bit periods included in the first data signal.

27. A method of testing an electronic device, comprising initializing a circuit for processing data signals;

establishing a transmission delay for a first data signal of the data signals, said transmission delay offsetting a sampling position within each cycle of the first data signal, said sampling position subsequently occurring within a stable region of said each cycle of the first data signal; and testing an electronic device with a second data signal of the data signals, said second data signal subject to the transmission delay.

* * * * *

UNITED STATES PATENT AND TRADEMARK OFFICE

CERTIFICATE OF CORRECTION

PATENT NO. : 6,937,949 B1
APPLICATION NO. : 10/285082
DATED : August 30, 2005
INVENTOR(S) : Fishman et al.

It is certified that error appears in the above-identified patent and that said Letters Patent is hereby corrected as shown below:

Drawings
Sheet 2, Figure 2, change reference numeral "26" to --264--

Column 1
Line 32, change "DAT" to --DUT--
Line 47, change "to the DUT" to --of the DUT--

Column 2
Line 1, change "$j=|t_{ideal}t_{actual}/$" to --$j = | t_{ideal} - t_{actual} /$--
Line 3, change "tactual" to --$t_{actual}$--
Line 41, change "amount jitter" to --amount of jitter--

Column 4
Line 9, change "the at" to --the time at--
Line 17, change "(5)" to --(6)--

Column 5
Line 67, change "an bit" to --a bit--

Column 8
Line 6, change "$D_{in}$" to --$D_{out}$--
Line 9, change "$D_{in}$ port 134/ $D_{out}$ port 138" to -- $D_{in}$ port 138/ $D_{out}$ port 134--

Column 9
Line 2, change "frequence" to --frequency--
Line 5, change "0," to --0 picoseconds,--

Column 11
Line 13, change "156, 152" to --152, 156--

Column 15
Line 62, before "to transmit" change "use" to --uses--

Column 16
Line 49, change "a integer" to --an integer--

Column 19
Line 19, change "particular, the $D_{in}$" to --particular, the $D_{out}$--

UNITED STATES PATENT AND TRADEMARK OFFICE

CERTIFICATE OF CORRECTION

PATENT NO. : 6,937,949 B1

APPLICATION NO. : 10/285082

DATED : August 30, 2005

INVENTOR(S) : Fishman et al.

It is certified that error appears in the above-identified patent and that said Letters Patent is hereby corrected as shown below:

<u>Column 20</u>

Line 48, change “was as” to --as was--

Line 51, before “After” begin a new paragraph.

<u>Column 22</u>

Line 22, change “from the pattern” to --from the pattern,--

<u>Column 23</u>

Line 31, change “an ideal value” to --an ideal value,--

Line 62, change “sign” to --signal--

<u>Column 24</u>

Line 10, after “less than” insert --that--

Line 18, change “sign” to --signal--

Line 47, change “said adjusted” to --said first adjusted--

<u>Column 25</u>

Line 25, change “Variations” to --variations--

Signed and Sealed this

Thirteenth Day of November, 2007

JON W. DUDAS

*Director of the United States Patent and Trademark Office*